United States Patent
Yano et al.

(10) Patent No.: US 10,580,754 B2
(45) Date of Patent: Mar. 3, 2020

(54) SEMICONDUCTOR MODULE WITH TEMPERATURE DETECTING ELEMENT

(71) Applicant: Mitsubishi Electric Corporation, Chiyoda-ku (JP)

(72) Inventors: Shinya Yano, Chiyoda-ku (JP); Shinichi Kinouchi, Chiyoda-ku (JP); Yasushi Nakayama, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/078,991

(22) PCT Filed: Mar. 13, 2017

(86) PCT No.: PCT/JP2017/009969
§ 371 (c)(1),
(2) Date: Aug. 22, 2018

(87) PCT Pub. No.: WO2017/169693
PCT Pub. Date: Oct. 5, 2017

(65) Prior Publication Data
US 2019/0051640 A1    Feb. 14, 2019

(30) Foreign Application Priority Data

Apr. 1, 2016   (JP) .................................. 2016-074350

(51) Int. Cl.
*H01L 25/065*   (2006.01)
*G01K 7/01*   (2006.01)
(Continued)

(52) U.S. Cl.
CPC ............ *H01L 25/0652* (2013.01); *G01K 7/01* (2013.01); *H01L 23/057* (2013.01);
(Continued)

(58) Field of Classification Search
CPC ............................ G01K 7/01; H01L 27/0255
(Continued)

(56) References Cited

U.S. PATENT DOCUMENTS

2003/0020131 A1* 1/2003 Asam ................. G01R 31/2856
                                                                257/467
2009/0057832 A1* 3/2009 Kouno ................ H01L 29/7397
                                                                257/577
(Continued)

FOREIGN PATENT DOCUMENTS

JP        1-231638 A     9/1989
JP     2005-166987 A     6/2005
(Continued)

OTHER PUBLICATIONS

International Search Report dated May 30, 2017 in PCT/JP2017/009969 filed Mar. 13, 2017.
(Continued)

*Primary Examiner* — Lex H Malsawma
*Assistant Examiner* — Eric W Jones
(74) *Attorney, Agent, or Firm* — Oblon, McClelland, Maier & Neustadt, L.L.P.

(57) ABSTRACT

In a semiconductor module, first and second semiconductor chips each include a transistor and a temperature-detecting diode connected between first and second control pads. The first control pad of the first semiconductor chip is connected to a first control terminal, the second control pad of the first semiconductor chip and the first control pad of the second semiconductor chip are connected to a second control terminal, and the second control pad of the second semiconductor chip is connected to a third control terminal.

16 Claims, 14 Drawing Sheets

(51) Int. Cl.

| | | |
|---|---|---|
| H01L 25/07 | (2006.01) | |
| H02M 1/00 | (2006.01) | |
| H02M 7/48 | (2007.01) | |
| H01L 25/18 | (2006.01) | |
| H01L 23/057 | (2006.01) | |
| H01L 23/31 | (2006.01) | |
| H01L 23/48 | (2006.01) | |
| H01L 23/495 | (2006.01) | |
| H01L 23/498 | (2006.01) | |
| H01L 23/538 | (2006.01) | |
| H01L 23/00 | (2006.01) | |
| H01L 25/10 | (2006.01) | |
| H01L 25/11 | (2006.01) | |
| H01L 25/16 | (2006.01) | |
| H01L 27/02 | (2006.01) | |
| H02M 7/5387 | (2007.01) | |
| H02M 7/00 | (2006.01) | |
| G01K 7/22 | (2006.01) | |
| H01L 23/24 | (2006.01) | |
| H01L 23/29 | (2006.01) | |
| H01L 23/367 | (2006.01) | |
| H01L 29/16 | (2006.01) | |
| H01L 29/739 | (2006.01) | |
| H01L 29/78 | (2006.01) | |
| H02M 1/32 | (2007.01) | |

(52) U.S. Cl.
CPC ........ *H01L 23/3121* (2013.01); *H01L 23/481* (2013.01); *H01L 23/49541* (2013.01); *H01L 23/49575* (2013.01); *H01L 23/49844* (2013.01); *H01L 23/5386* (2013.01); *H01L 24/40* (2013.01); *H01L 24/41* (2013.01); *H01L 25/07* (2013.01); *H01L 25/072* (2013.01); *H01L 25/105* (2013.01); *H01L 25/115* (2013.01); *H01L 25/162* (2013.01); *H01L 25/165* (2013.01); *H01L 25/18* (2013.01); *H01L 27/0255* (2013.01); *H01L 27/0288* (2013.01); *H01L 27/0292* (2013.01); *H02M 1/00* (2013.01); *H02M 7/003* (2013.01); *H02M 7/48* (2013.01); *H02M 7/5387* (2013.01); *H02M 7/53873* (2013.01); *G01K 7/22* (2013.01); *H01L 23/24* (2013.01); *H01L 23/293* (2013.01); *H01L 23/367* (2013.01); *H01L 23/49513* (2013.01); *H01L 23/49811* (2013.01); *H01L 24/29* (2013.01); *H01L 24/32* (2013.01); *H01L 24/37* (2013.01); *H01L 24/45* (2013.01); *H01L 24/48* (2013.01); *H01L 29/1608* (2013.01); *H01L 29/7395* (2013.01); *H01L 29/7805* (2013.01); *H01L 2224/29139* (2013.01); *H01L 2224/32245* (2013.01); *H01L 2224/3716* (2013.01); *H01L 2224/37147* (2013.01); *H01L 2224/37565* (2013.01); *H01L 2224/4005* (2013.01); *H01L 2224/40101* (2013.01); *H01L 2224/40105* (2013.01); *H01L 2224/40137* (2013.01); *H01L 2224/40175* (2013.01); *H01L 2224/40491* (2013.01); *H01L 2224/41051* (2013.01); *H01L 2224/45124* (2013.01); *H01L 2224/45144* (2013.01); *H01L 2224/45147* (2013.01); *H01L 2224/48091* (2013.01); *H01L 2224/48101* (2013.01); *H01L 2224/48106* (2013.01); *H01L 2224/48137* (2013.01); *H01L 2224/48157* (2013.01); *H01L 2224/48175* (2013.01); *H01L 2224/48177* (2013.01); *H01L 2224/49175* (2013.01); *H01L 2224/73221* (2013.01); *H01L 2224/73263* (2013.01); *H01L 2224/73265* (2013.01); *H01L 2924/014* (2013.01); *H01L 2924/01402* (2013.01); *H01L 2924/12036* (2013.01); *H01L 2924/13055* (2013.01); *H01L 2924/13091* (2013.01); *H01L 2924/16196* (2013.01); *H01L 2924/16251* (2013.01); *H01L 2924/17151* (2013.01); *H02M 2001/0009* (2013.01); *H02M 2001/327* (2013.01)

(58) Field of Classification Search
USPC .......................................... 257/467
See application file for complete search history.

(56) References Cited

U.S. PATENT DOCUMENTS

| | | | |
|---|---|---|---|
| 2011/0215400 A1* | 9/2011 | Nakamura | H01L 29/66 257/334 |
| 2012/0248564 A1* | 10/2012 | Hauenstein | H01L 23/34 257/467 |
| 2013/0322487 A1 | 12/2013 | Watanabe et al. | |
| 2014/0035658 A1* | 2/2014 | Usui | G05F 1/10 327/512 |
| 2014/0070319 A1* | 3/2014 | Tonomura | H01L 27/0211 257/355 |
| 2016/0133620 A1* | 5/2016 | Pedone | H01L 27/0259 257/140 |

FOREIGN PATENT DOCUMENTS

| | | |
|---|---|---|
| JP | 2013-250175 A | 12/2013 |
| WO | WO 2014/046058 A1 | 3/2014 |

OTHER PUBLICATIONS

Japanese Office Action dated Aug. 6, 2019 in Japanese Patent Application No. 2018-508942 (with unedited computer generated English translation), 11pages.

* cited by examiner

SEMICONDUCTOR MODULE WITH TEMPERATURE DETECTING ELEMENT

TECHNICAL FIELD

The present invention relates to a semiconductor module and more particularly to a semiconductor module including a temperature detecting element for detecting the temperature of a semiconductor device.

BACKGROUND ART

PTD 1 discloses a power conversion device including first and second semiconductor modules. Each of the first and second semiconductor modules includes a switching element first and second external terminals, and a diode connected between the first and second external terminals for detecting the temperature of the switching element. The switching elements of the first and second semiconductor modules are connected in parallel with each other.

The first external terminal of the first semiconductor module receives constant current from a constant current source the second external terminal of the first semiconductor module is connected to the first external terminal of the second semiconductor module through a wiring pattern, and the second external terminal of the second semiconductor module receives a ground potential. The voltage between the first external terminal of the first semiconductor module and the second external terminal of the second semiconductor module changes according to the average temperature of the switching elements of the first and second semiconductor modules. When the average temperature exceeds a threshold temperature, current flowing through the switching elements is reduced, and overheat of the switching elements is prevented.

CITATION LIST

Patent Document

PTD 1 Japanese Patent Laying-Open No. 2013-250175

SUMMARY OF INVENTION

Technical Problem

Unfortunately, in PTD 1 since four external terminals are provided for two diodes, the number of external terminals is large, resulting in a large size of the power conversion device.

A main object of the present invention is therefore to provide a semiconductor module capable or achieving size reduction or the device.

Solution to Problem

A semiconductor module according to the present invention includes first to N-th semiconductor chips, and first and second external terminals. N is an integer equal to or greater than two. Each of the first to N-th semiconductor chips includes a switching element, first and second internal terminals, and a temperature detecting element connected between the first and second internal terminals and having a resistance value changing according to temperature of the switching element. The first internal terminal of the first semiconductor chip is connected to the first external terminal. The second internal terminal of the N-th semiconductor chip is connected to the second external terminal. Given that n is an integer equal to or greater than one and equal to or smaller than (N−1), one of the first and second internal terminals of the n-th semiconductor chip and one of the first and second internal terminals of the (n−1)th semiconductor chip are connected with each other.

Advantageous Effects of Invention

In the semiconductor module according to the present invention, since the first or second internal terminal of the n-th semiconductor chip and the first or second internal terminal or the (n−1)th semiconductor chip are connected with each other, the number of external terminals can be set to any one of 2 to (N−1). Therefore, compared with a conventional example in which 2N external terminals are provided for N temperature detecting elements, the number of external terminals can be reduced, thereby achieving size reduction of the device.

DESCRIPTION OF EMBODIMENTS

First Embodiment

Figure 1:
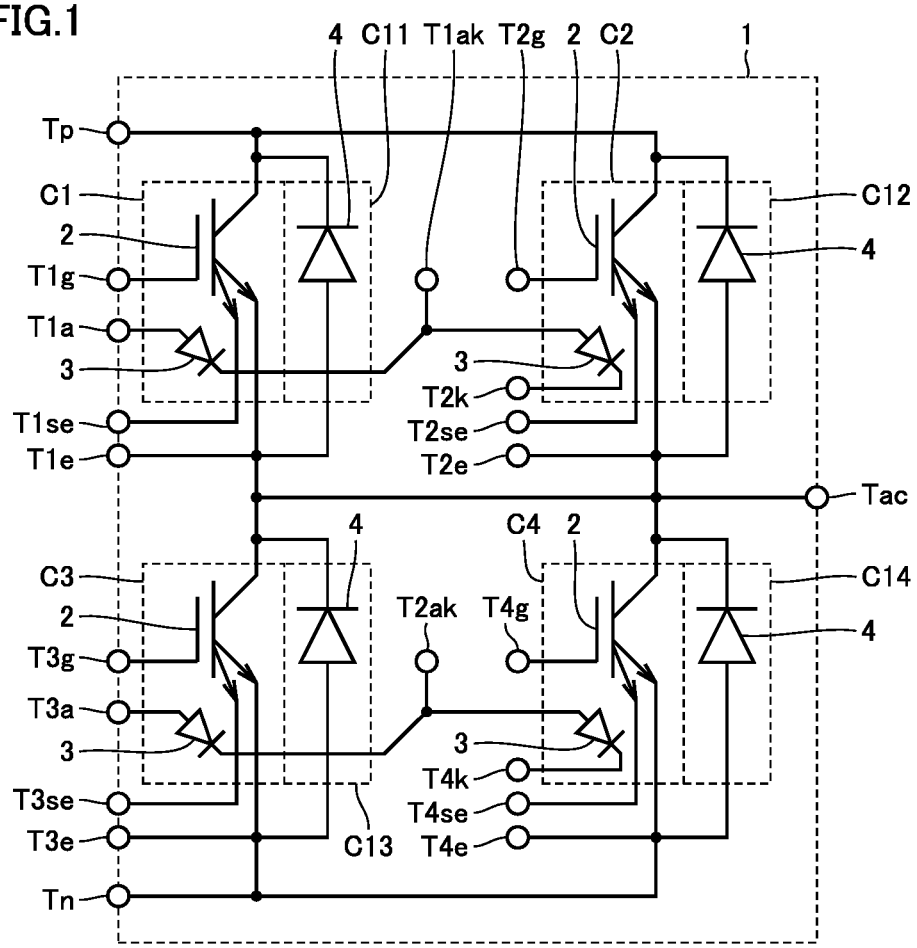
FIG. 1 is a circuit diagram showing a configuration of a semiconductor module according to a first embodiment of the present invention.

FIG. 1 is a circuit diagram showing a configuration of a semiconductor module 1 according to a first embodiment of the present invention. Two or three semiconductor modules 1 shown in FIG. 1 are connected in parallel to form an inverter that converts direct-current (DC) power into alternating-current (AC) power.

Semiconductor module 1 includes four switching semiconductor chips C1 to C4 and four rectifying semiconductor chips C11 to C14. Each of semiconductor chips C1 to C4 includes a transistor 2 (switching element) and a diode 3 for detecting the temperature of transistor 2. Transistor 2 is, for example, an IGBT (Insulated Gate Bipolar Transistor) and includes a collector, a gate, an emitter, and a sense emitter, Minute current having a value corresponding to the collector current flows through the sense emitter. Each of semiconductor chips C11 to C14 includes a freewheel diode 4.

This semiconductor module 1 further includes, as external terminals, DC terminals Tp and Tn, an AC terminal Tac, control terminals T1g, T1a, T1se, and T1e provided corresponding to semiconductor chip C1 control terminals T2g, T2k, T2se, and T2e provided corresponding to semiconductor chip C2, control terminals T3g, T3a, T3se, and T3e provided corresponding to semiconductor chip C3, control terminals T4g, T4k, T4se, and T4e provided corresponding to semiconductor chip C4, a control terminal T1ak shared by semiconductor chips C1 and C2, and a control terminal T2ak shared by semiconductor chips C3 and C4.

The collectors of transistors 2 of semiconductor chips C1 and C2 are both connected to DC terminal Tp, and the emitters thereof are both connected to AC terminal Tac. The collectors of transistors 2 of semiconductor chips C3 and C4 are both connected to AC terminal Tac, and the emitters thereof are both connected to DC terminal Tn.

Transistors 2 of semiconductor chips C1 to C4 have their gates connected to control terminals T1g to T4g, respectively, their emitters connected to control terminals T1e to T4e, respectively, and their sense emitters connected to control terminals T1se to T4se, respectively.

Temperature-detecting diodes 3 of semiconductor chips C1 and C3 have their anodes connected to control terminals T1a and T3a, respectively, and their cathodes connected to control terminals T1ak and T2ak, respectively. Temperature-detecting diodes 3 of semiconductor chips C2 and C4 have their anodes connected to control terminals T1ak and T2ak, respectively, and their cathodes connected to control terminals T2k and T4k, respectively.

Freewheel diodes 4 of semiconductor chips C11 to C14 have their anodes connected to the emitters of transistors 2 of semiconductor chips C1 to C4, respectively, and their cathodes connected to the collectors of transistors 2 of semiconductor chips C1 to C4, respectively. That is, freewheel diodes 4 are connected in anti-parallel with the corresponding transistors 2.

Figure 2:
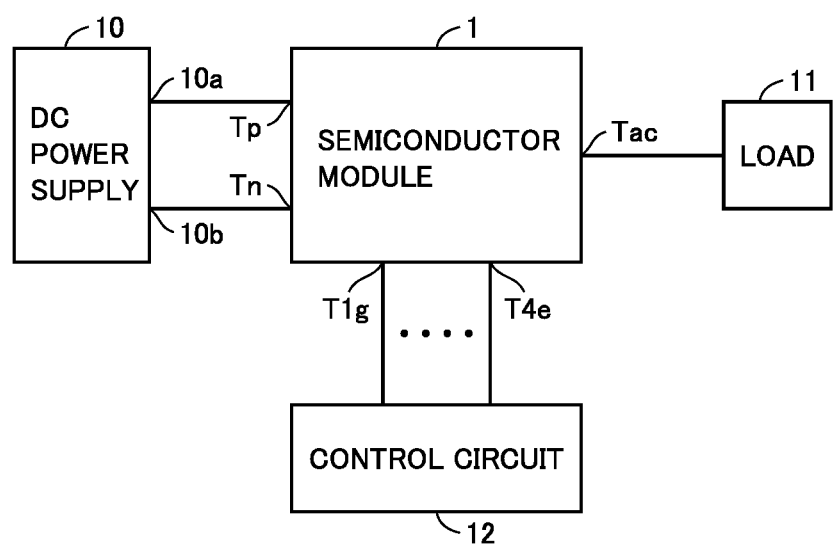
FIG. 2 is a block diagram illustrating how the semiconductor module shown in FIG. 1 is used.

FIG. 2 is a block diagram illustrating how semiconductor module 1 is used. In FIG. 2, DC terminals Tp and Tn are connected to a positive-side output terminal 10a and a negative-side output terminal 10b, respectively, of a DC power supply 10. DC power supply 10 may be a battery or may be a converter that converts AC voltage into DC voltage. AC terminal Tac is connected to a load 11 (for example, motor) driven with AC voltage supplied from semiconductor module 1. The block of the semiconductor module shown in FIG. 2 may include a plurality of semiconductor modules.

Control terminals T1g to T4g, T1se to T4se, T1e to T4e, T1a, T3a, T1ak, T2ak, T2k, and T4k are connected to a control circuit 12 for controlling semiconductor module 1.

Control circuit 12 applies a first control signal between control terminals T1g and T1e for turning on and off transistor 2 of semiconductor chip C1. Control circuit 12 applies a second control signal between control terminals T2g, and T2e for turning, on and off transistor 2 of semiconductor chip C2. Control circuit 12 applies a third control signal between control terminals T3g and T3e for turning on and off transistor 2 of semiconductor chip C3. Control circuit 12 applies a fourth control signal between control terminals and T4g and T4e for turning on and off transistor 2 of semiconductor chip C4.

When the first to fourth control signals are set to "H" level, the transistors 2 of semiconductor chips C1 to C4 turn on, and when the first to fourth control signals are set to "L" level, the transistors 2 of semiconductor chips C1 to C4 turn off. Transistors 2 of semiconductor chips C1 and C2 are simultaneously turned on, and transistors 2 of semiconductor chips C3 and C4 are simultaneously turned on. Transistors 2 of semiconductor chips C1 and C2 are connected in parallel, and transistors 2 of semiconductor chips C3 and C4 are connected in parallel whereby load current larger than rating current of a single transistor 2 can be supplied. Transistors 2 of semiconductor chips C1 and C2 are not turned on simultaneously with transistors 2 of semiconductor chips C3 and C4.

When transistors 2 of semiconductor chips C1 and C2 are turned on, current flows from DC terminal Tp to AC terminal Tac through transistors 2 of semiconductor chips C1 and C2. When transistors 2 of semiconductor chips C3 and C4 are turned on, current flows from AC terminal Tac to DC terminal Tn through transistors 2 of semiconductor chips C3 and C4. Therefore, for example, transistors 2 of semiconductor chips C1 and C2 and transistors 2 of semiconductor chips C3 and C4 are turned on alternately to allow AC power to be output to AC terminal Tac.

Furthermore, three semiconductor modules 1 may be provided to perform PWM (Pulse Width Modulation) control with three semiconductor modules 1 phase-shined by 120 degrees, so that three phase AC voltages can be output from three AC terminals Tac.

Furthermore, control circuit 12 detects collector currents of transistors 2 of semiconductor chips C1 to C4, based on minute currents flowing out of control terminals T1se to T4se. When the detected value of collector current of any of transistors 2 of semiconductor chips C1 to C4 exceeds a predetermined upper limit value, that is, when overcurrent flows through any of transistors 2 of semiconductor chips C1 to C4, control circuit 12 sets the first and second, or the third and fourth, or the first to fourth control signals to "L" level to turn off all the transistors 2. At this point of time, DC power supply 10 may be electrically cut off from semiconductor module 1, or semiconductor module 1 may be electrically cut off from load 11.

Furthermore, control circuit 12 detects temperatures T1 to T4 of transistors 2 of semiconductor chips C1 to C4, based on forward voltages VF1 to VF4 of temperature-detecting diodes 3 of semiconductor chips C1 to C4. Control circuit 12 adjusts, for example, the on time (that is, current) and the on and off frequencies of the transistors of semiconductor chips C1 to C4 such that temperatures T1 to T4 of transistors 2 of semiconductor chips C1 to C4 do not exceed a predetermined upper limit temperature.

Figure 3:
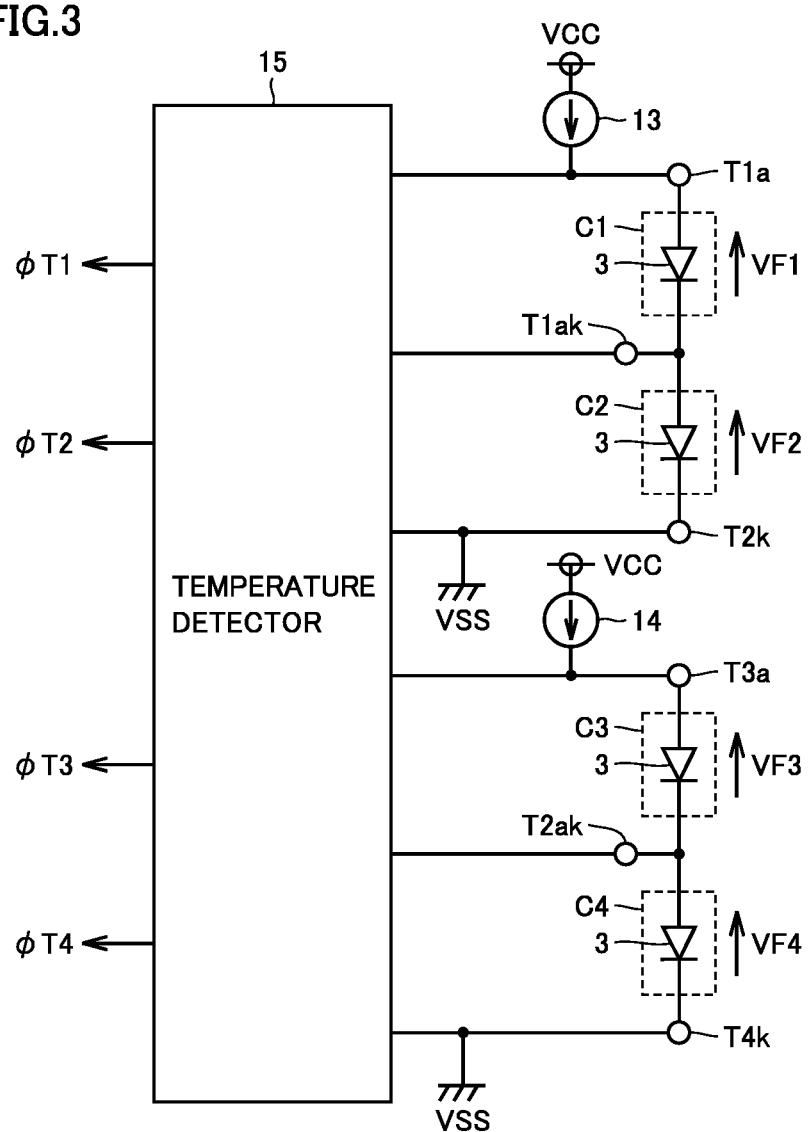
FIG. 3 is a circuit block diagram showing a configuration of a part related to detection of temperature of transistors in a control circuit shown in FIG. 2.

FIG. 3 is a circuit block diagram showing a part related to detection of temperature of transistors 2 in control circuit 12. In FIG. 3, control circuit 12 includes constant current sources 13 and 14 and a temperature detector 15. Control terminals T1a, T1ak, T2k, T3a, T2ak, and T4k are all connected to temperature detector 15. Constant current source 13 is connected between the line of power supply voltage VCC and control terminal T1a. Constant current source 14 is connected between the line of power supply voltage VCC and control terminal T3a. Control terminals T2k and T4k are both connected to the line of ground voltage VSS. Although control terminals T2k and T4k are connected to the lines of the same voltage here, they may be connected to lines of different voltages.

Constant current is thus fed to each of diodes 3 of semiconductor chips C1 to C4, and Forward voltages VF1 to VF4 are produced in diodes 3 of semiconductor chips C1 to C4, respectively. When transistors 2 of semiconductor chips C1 to C4 are turned and off, a loss occurs in each transistor 2 (switching loss, conduction loss), and this loss generates heat to increase the temperature of transistor 2.

When temperatures T1 to T4 of transistors 2 of semiconductor chips C1 to C4 rise, electric resistance values R1 to R4 of diodes 3 of semiconductor chips C1 to C4 decrease accordingly, and forward voltages VF1 to VF4 of diodes 3 of semiconductor chips C1 to C4 decrease. Temperature detector 15 obtains temperatures T1 to T4 of transistors 2 of semiconductor chips C1 to C4 based on forward voltages VF1 to VF4 and outputs signals φT1 to φT4 indicating the obtained temperatures T1 to T4. Control circuit 12 adjusts, for example, the on time (that is, current) and the on and off frequencies of transistors 2 of semiconductor chips C1 to C4 such that temperatures T1 to T4 indicated by signals φT1 to φT4 do not exceed a predetermined upper limit temperature.

Figure 4:
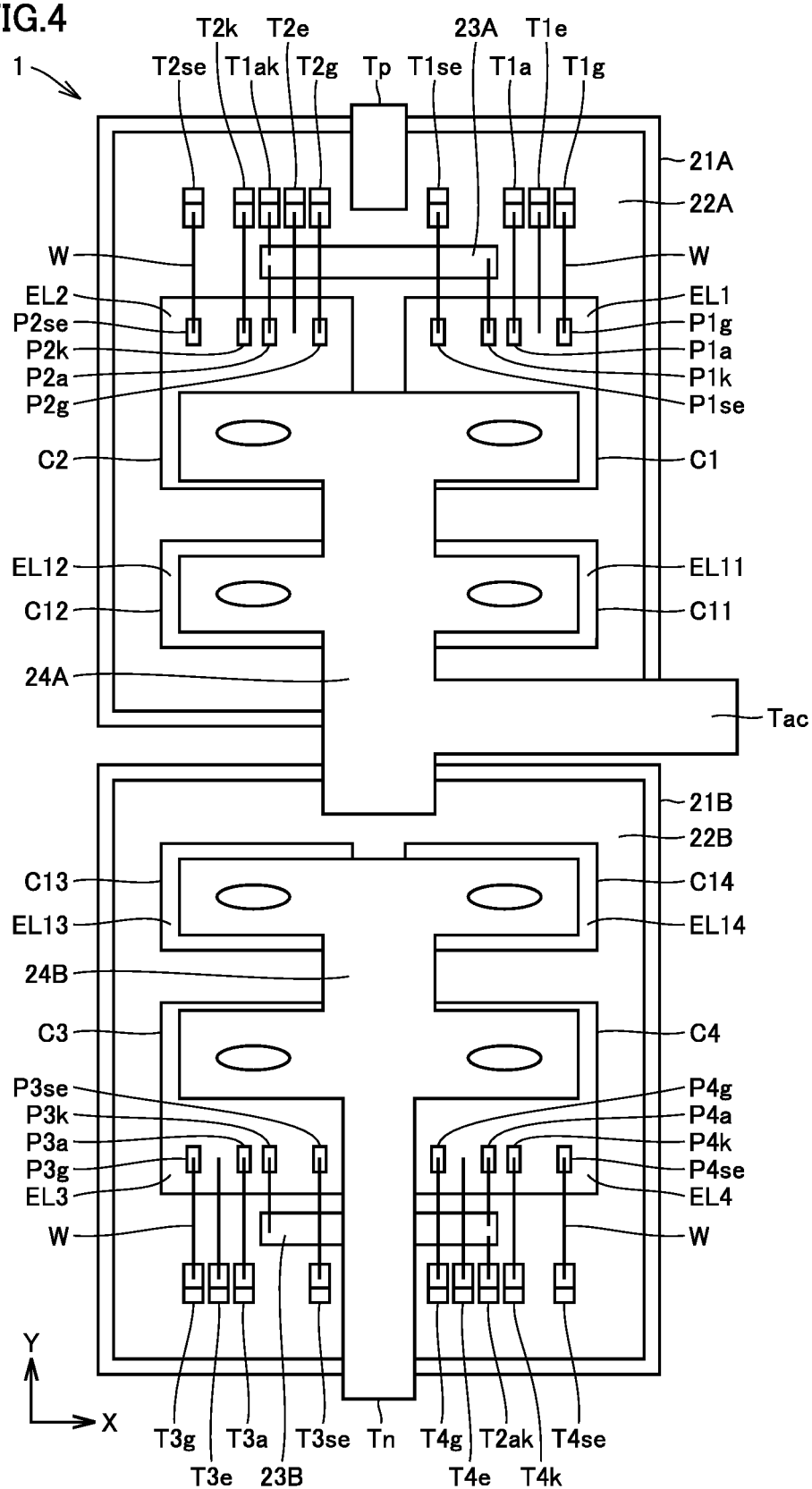
FIG. 4 is a diagram showing a layout of the semiconductor module shown in FIG. 1.

FIG. 4 is a diagram showing a layout of semiconductor module 1. In FIG. 4, semiconductor module 1 includes two substrates 21A and 21B disposed vertically in the figure. Each of substrates 21B and 21B is formed of an insulator in a rectangular shape. The short side of each of substrates 21A and 21B extends in the X direction (horizontal direction) in the figure, and the long side of each substrate 21A and 21B extends in the Y direction (vertical direction) in the figure. Conductor layers 224 and 22B are formed on the front surfaces of substrates 21A and 21B, respectively. In the center region of the front surface of conductor layer 224, semiconductor chips C2 and C1 are disposed n the left and the right in the figure.

In an upper end portion in the figure of the front surface of semiconductor chip C1, control pads (internal terminals) P1se, P1k, P1a, and P1g are sequentially disposed in the X direction. An emitter electrode EL1 is formed in a region of the front surface of semiconductor chip C1, excluding control pads P1se, P1k, P1a, and P1g. Control pad P1se, control pad P1g, and emitter electrode EL1 are respectively connected to the sense emitter, the gate, and the emitter of transistor 2 of semiconductor chip C1.

Control pads P1k and P1a are disposed adjacent to each other and respectively connected to the cathode and the anode of temperature-detecting diode 3 of semiconductor chip C1. Control pad P1a receiving temperature detecting current and control pad P1k receiving temperature detecting current are disposed adjacent to each other to cancel a magnetic field produced by the temperature detecting current and eliminate or reduce the effect of the magnetic field produced by current flowing through the main circuit while reducing noise by the magnetic field. On the back side of semiconductor chip C1, a collector electrode (not shown) connected to the collector of transistor 2 is formed, and the collector electrode is connected to conductor layer 22A.

In an upper end portion in the figure of the front surface of semiconductor chip C2, control pads P2se, P2k, P2a, and P2g are sequentially disposed in the X direction. An emitter electrode EL2 is formed in a region of the front surface of semiconductor chip C2, excluding control pads P2se, P2k, P2a, and P2g. Control pad P2se, control pad P2g, and emitter electrode EL2 are respectively connected to the sense emitter, the gate, and the emitter of transistor 2 of semiconductor chip C2.

Control pads P2k and P2a are disposed adjacent to each other and respectively connected to the cathode and the anode of temperature-detecting diode 3 of semiconductor chip C2. Control pad P2a receiving temperature detecting current and control pad P2k receiving temperature detecting current are disposed adjacent to each other to cancel a magnetic field produced by the temperature detecting current and reduce noise by the magnetic field. On the back surface of semiconductor chip C2, a collector electrode (not shown) connected to the collector of transistor 2 is formed, and the collector electrode is connected to conductor layer 22A.

In an upper region in the figure of the front surface of conductor layer 22A, control terminals T2se, T2k, T1ak, T2e, T2g, T1se, T1a, T1e, and T1g are sequentially disposed in the X direction. Control terminals T2se, T2k, T1ak, T2g, T1se, T1a, and T1g are respectively disposed in the Y direction of control pads P2se, P2k, P2a, P2g, P1se, P1a, and P1g.

Control terminal T2e is disposed between control terminals T1ak and T2g. Control terminal T1e is disposed between control terminals T1a and T1g. Each of control terminals T2se, T2k, T1ak, T2e, T2g, T1se, T1a, T1e, and T1g is formed in an L shape as viewed in the X direction and insulated from conductor layer 22A.

At the front surface of conductor layer 22A, a strip-like wiring portion 23A is formed in a region between semiconductor chips C2, C1 and control terminals T2se, T2k, T1ak, T2e, T1se, T1a, T1e, T1g. The distance from control terminals T2se, T2k, T1ak, T2e, T2g, T1se, T1a, T1c, and T1g to semiconductor chips C2 and C1 is larger than the distance from wiring portion 23A to semiconductor chips C2 and C1. Wiring portion 23A extends in the X direction and is insulated from conductor layer 22A.

One end portion of wiring portion 23A is connected to control pad P2a through metal wire W and connected to the front surface of the lower end portion of control terminal T1ak through metal wire W. The other end portion of wiring portion 23A is connected to control pad P1k through metal wire W. Thus, the cathode of temperature-detecting diode 3 of semiconductor chip C1 and the anode of temperature-detecting diode 3 of semiconductor chip C2 are connected to control terminal T1ak.

Control pad P1a of semiconductor chip C1 is connected to the front surface of the lower end portion of control terminal T1a through metal wire W, and control pad P2k of semiconductor chip C2 is connected to the Front surface of the lower end portion of control terminal T2k through metal wire W. Thus, the anode of temperature-detecting diode 3 of semiconductor chip C1 is connected to control terminal T1a, and the cathode or temperature-detecting diode 3 of semiconductor chip C2 is connected to control terminal T2k.

Control pad P1se of semiconductor chip C1 is connected to the front surface of the lower end portion of control terminal T1se through metal wire W, emitter electrode EL1 is connected to the front surface of the lower end portion of control terminal T1e through metal wire W, and control pad P1g is connected to the front surface of the lower end portion of control terminal T1g through metal wire W. Thus, the sense emitter, the emitter, and the gate of transistor 2 of semiconductor chip C1 are respectively connected to control terminals T1se, T1e, and T1g.

Control pad P2*se* of semiconductor chip C2 is connected to the front surface of the lower end portion of control terminal T2*se* through metal wire W, emitter electrode EL2 is connected to the front surface of the lower end portion of control terminal T2*e* through metal wire W, and control pad P2*g* is connected to the front surface of the lower end portion of control terminal T2*g* through metal wire W. Thus, the sense emitter, the emitter, and the gate of transistor 2 of semiconductor chip C2 are respectively connected to control terminals T2*se*, T2*e*, and T2*g*.

In the lower region in the figure of the front surface of conductor layer 22A, semiconductor chips C12 and C11 are disposed on the left and the right. An anode electrode EL11 is formed on the front surface of semiconductor chip C11. Anode electrode EL11 is connected to the anode of diode 4 of semiconductor chip C11. A cathode electrode (not shown) is formed on the back surface of semiconductor chip C11, and the cathode electrode is connected to the cathode of diode 4 of semiconductor chip C11 and connected to conductor layer 22A.

An anode electrode EL12 is formed on the front surface of semiconductor chip C12. Anode electrode EL12 is connected to the anode of diode 4 of semiconductor chip C12. A cathode electrode (not shown) is formed on the hack surface of semiconductor chip C12, and the cathode electrode is connected to the cathode of diode 4 of semiconductor chip C12 and connected to conductor layer 22A.

DC terminal Tp is formed at the upper end center portion in the figure of the front surface of conductor layer 22A. DC terminal Tp is connected to conductor layer 22A. Thus, the collectors of transistors 2 of semiconductor chips C1 and C2 and the cathodes of diodes 4 of semiconductor chips C11 and C12 are connected to DC terminal Tp.

A lead frame 24A is provided on semiconductor chips C1, C2, C11, and C12. Lead frame 24A is connected to emitter electrode EL1 of semiconductor chip C1, emitter electrode EL2 of semiconductor chip C2, anode electrode EL11 of semiconductor chip C11, anode electrode EL12 of semiconductor chip C12, and the upper end center portion in the figure of conductor layer 22B. Part of lead frame 24A extends in the X direction, and its front end portion is used as AC terminal Tac. Thus, the emitters of transistors 2 of semiconductor chips C1 and C2 and the anodes of diodes 4 of semiconductor chips C11 and C12 are connected to AC terminal Tac.

In the center region of the front surface of conductor layer 22B, semiconductor chips C3 and C4 are disposed on the left and the right in the figure. In the lower end portion in the figure of the front surface of semiconductor chip C3, control pads P3*g*, P3*a*, P3*k*, and P3*se* are sequentially disposed in the X direction. An emitter electrode EL3 is formed in a region of the front surface of semiconductor chip C3, excluding control pads P3*g*, P3*a*, P3*k*, and P3*se*. Control pad P3*g*, control pad P3*se*, and emitter electrode EL3 are respectively connected to the gate, the sense emitter, and the emitter of transistor 2 of semiconductor chip C3.

Control pads P3*a* and P3*k* are disposed adjacent to each other and respectively connected to the anode and the cathode of temperature-detecting diode 3 of conductor chip C3. Control pad P3*a* receiving temperature detecting current and control pad P3*k* receiving temperature detecting current are disposed adjacent to each other to cancel a magnetic field produced by the temperature detecting current and reduce noise by the magnetic field. A collector electrode (not shown) connected to the collector of transistor 2 is Conned on the back surface of semiconductor chip C13, and the collector electrode is connected to conductor layer 22B.

In the lower end portion in the figure of the front surface of semiconductor chip C4, control pads P4*g*, P4*a*, P4*k*, and P4*se* are sequentially disposed in the X direction. An emitter electrode EL4 is formed in a region of the front surface of semiconductor chip C4, excluding control pads P4*g*, P4*a*, P4*k*, and P4*se*. Control pad P4*g*, control pad P4*se*, and emitter electrode EL4 are respectively connected to the gate, the sense emitter, and the emitter of transistor 2 of semiconductor chip C4.

Control pads P4*a* and P4*k* are disposed adjacent to each other and respectively connected to the anode and the cathode of diode 3 of semiconductor chip C4. Control pad P4*a* receiving temperature detecting current and control pad P4*k* receiving temperature detecting current are disposed adjacent to each other to cancel a magnetic field produced by the temperature detecting current and eliminate or reduce the effect of the magnetic field produced by current flowing through the main circuit while reducing noise by the magnetic field. A collector electrode (not shown) connected to the collector of transistor 2 is formed on the back surface of semiconductor chip C4, and the collector electrode is connected to conductor layer 22B.

In the lower region in the figure of the front surface of conductor layer 22B control terminals T3*g*, T3*e*, T3*a*, T3*se*, T4*g*, T4*e*, T2*ak*, T4*k*, and T4*se* are sequentially arranged in the X direction. Control terminals T3*g*, T3*a*, T3*se*, T4*g*, T2*ak*, T4*k*, and T4*se* are disposed in the Y direction of control pads P3*g*, P3*a*, P3*se*, P4*g*, P2*ak*, P4*k*, and P4*se*, respectively.

Control terminal T3*e* is disposed between control terminals T3*g* and T3*a*. Control terminal T4*e* is disposed between control terminals T4*g* and T2*ak*. Each of control terminals T3*g*, T3*e*, T3*a*, T3*se*, T4*g*, T4*e*, 1'2*ak*, T4*k*, and T4*se* is formed in an L shape as viewed in the X direction and insulated from conductor layer 22B.

At the front surface of conductor layer 22B, a strip-like wiring portion 23B is formed in a region between semiconductor chips C3, C4 and control terminals T3*g*, T3*e*, T3*a*, T3*se*, T4*g*, T4*e*, T2*ak*, T4*k*, T4*se*. The distance from control terminals T3*g*, T3*e*, T3*a*, T3*se*, T4*g*, T4*e*, T2*ak*, T4*k*, and T4*se* to semiconductor chips C3 and C4 is larger than the distance from wiring portion 23B to semiconductor chips C3 and C4. Wiring portion 23B extends in file X direction and is insulated from conductor layer 22B.

One end portion of wiring portion 23B is connected to control pad P3*k* through metal wire W. The other end portion of wiring portion 23B is connected to control pad P4*a* through metal wire W and connected to the front surface of the lower end portion of control terminal T2*ak* through metal wire W. Thus, the cathode of temperature-detecting diode 3 of semiconductor chip C3 and the anode of temperature-detecting diode 3 of semiconductor chip C4 are connected to control terminal T2*ak*.

Control pad P3*a* of semiconductor chip C3 is connected to the front surface of the lower end portion of control terminal T3*a* through metal wire W, and control pad P4*k* of semiconductor chip C4 is connected to the front surface of the lower end portion of control terminal T4*k* through metal wire W. Thus, the anode of temperature-detecting diode 3 of semiconductor chip C3 is connected to control terminal T3*a*, and the cathode of temperature-detecting diode 3 of semiconductor chip C4 is connected to control terminal T4*k*.

Control pad P3*g* of semiconductor chip C3 is connected to the front surface of the lower end portion of control terminal T3*g* through metal wire W, control pad P3*se* is connected to the front surface of the lower end portion of control terminal T3*se* through metal wire W, and emitter electrode EL3 is connected to the front surface of the lower end portion of control terminal T3e through metal wire W. Thus, the gate, the sense emitter, and the emitter of transistor 2 of semiconductor chip C3 are respectively connected to control terminals T3g, T3se, and T3e.

Control pad P4g of semiconductor chip C4 is connected to the front surface of the lower end portion of control terminal T4g through metal wire W, control pad P4se is connected to the front surface of the lower end portion of control terminal T4se through metal wire W, and emitter electrode EL4 is connected to the front surface of the lower end portion of control terminal T4e through metal wire W. Thus, the gate, the sense emitter, and the emitter of transistor 2 of semiconductor chip C4 are respectively connected to control terminals T4g, T4se, and T4e.

In the upper region in the figure of the front surface of conductor layer 22B, semiconductor chips C13 and C14 are disposed on the left and the right. An anode electrode EL13 is formed on the front surface of semiconductor chip C13. Anode electrode EL13 is connected to the anode of diode 4 of semiconductor chip C13. A cathode electrode (not shown) is formed on the back surface of semiconductor chip C13, and the cathode electrode is connected to the cathode of diode 4 of semiconductor chip C13 and connected to conductor layer 22B.

An anode electrode EL14 is formed on the front surface of semiconductor chip C14. Anode electrode EL14 is connected to the anode of diode 4 of semiconductor chip C14. A cathode electrode (not shown) is formed on the back surface of semiconductor chip C14, and the cathode electrode is connected to the cathode of diode 4 of semiconductor chip C14 and connected to conductor layer 22B. Thus, the collectors of transistors 2 of semiconductor chips C3 and C4 and the cathodes of diodes 4 of semiconductor chips C13 and C14 are connected to AC terminal Tac.

A lead frame 24B is provided on semiconductor chips C3, C4, C13, and C14. Lead frame 24B is connected to emitter electrode EL3 of semiconductor chip C3, emitter electrode EL4 of semiconductor chip C4, anode electrode EL13 of semiconductor chip C13, and anode electrode EL14 of semiconductor chip C14. Part of lead frame 24B extends downward in the figure and its front end portion is used as DC terminal Tn. Thus, the emitters of transistors 2 of semiconductor chips C3 and C4 and the anodes of diodes 4 of semiconductor chips C13 and C14 are connected to DC terminal Tn.

Figure 5:
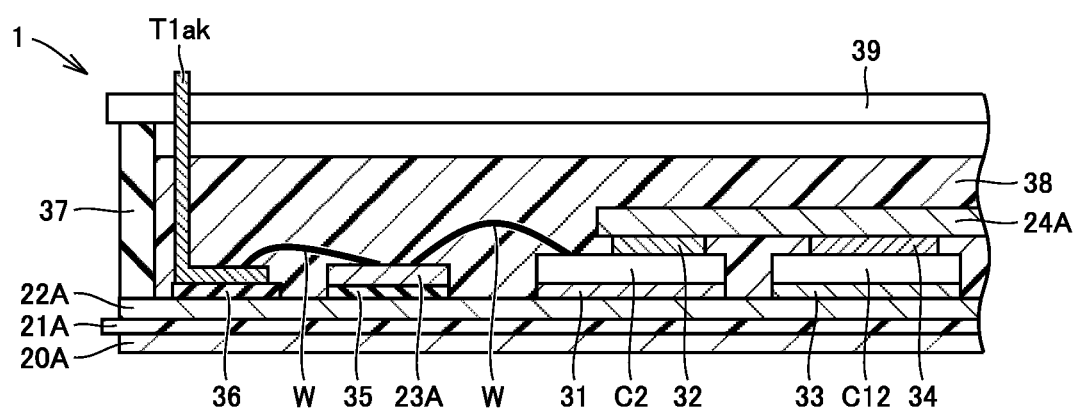
FIG. 5 is a cross-sectional view showing the main part of the semiconductor module shown in FIG. 4.

FIG. 5 is a cross-sectional view showing a main part of semiconductor module 1 shown in FIG. 4. In FIG. 5, a conductor layer 204 is formed on the back surface of substrate 214. Conductor layer 20A is affixed to a cooler (not shown) for cooling semiconductor module 1. Heat generated in transistor 2 is transmitted to the cooler and dissipated from the fin of the cooler into refrigerant.

Conductor layer 22A is formed on the front surface of substrate 21A. Semiconductor chips C2 and C12 are provided in the front surface or conductor layer 22A, and lead frame 24A is provided on semiconductor chips C2 and C12. The collector electrode on the lower surface of semiconductor chip C2 is bonded t the front surface of conductor layer 224 through a conductive bonding member 31, and emitter electrode EL2 on the upper surface of semiconductor chip C2 is bonded to the lower surface oaf lead frame 24A through a conductive bonding member 32. The cathode electrode on the lower surface of semiconductor chip C12 is bonded to the front surface of conductor layer 224 through a conductive bonding member 33, and anode electrode EL12 on the upper surface of semiconductor chip C12 is bonded to the lower surface of lead frame 244 through a conductive bonding member 34.

Lead frame 244 may be formed of metal such as copper or may be formed of a clad member having an alloy called invar sandwiched between copper. Bonding members 31 to 34 are formed of solder, silver, or the like. When lead frame 24A is bonded using solder, lead frames 244 and 24B in semiconductor module 1 may be bonded collectively.

A cushioning member for alleviating stress may be added between lead frame 24A and semiconductor chips C2 and C12. Instead of lead frame 244, a wire formed of metal such as aluminum, copper, and gold may be used.

Wiring portion 23A and L-shaped control terminal T1ak are further provided on the front surface of conductor layer 22A. An insulator layer 35 is provided between wiring portion 23A and conductor layer 22A. An insulator layer 36 is provided between control terminal T1ak and conductor layer 22A. Insulator layer 36 may be formed by an insert molding process or may be Formed by a molding process using epoxy resin. Insulator layer 36 may be affixed to the surface of conductor layer 224 using adhesive.

Wiring portion 234 is connected to control pad P2a (the anode of diode 3) of semiconductor chip C2 through metal wire W and connected to the front surface of the lower end portion of control terminal T1ak through metal wire W. Metal wire W is formed of metal such as aluminum, copper, and gold.

A tubular housing 37 is provided on the outer periphery of the front surface of conductor layer 22A. The inside of housing 37 is sealed by an insulating member 38, except for the upper end portion of the control terminal. The upper end portion of control terminal T1ak is exposed in the air. Insulating member 38 is gel, epoxy resin, or the like. The insulation distance can be reduced in the inside of insulating member 38 compared with in the air.

The opening on the upper side of housing 37 is closed by a control substrate 39. Control circuit 12 for controlling semiconductor module 1 is mounted on control substrate 39. The upper end portion of control terminal T1ak passes through control substrate 39 and is connected to control circuit 12. A cover for covering control substrate 39 may be further provided.

In semiconductor module 1 shown in FIG. 4, all the parts mounted on the front surface of conductor layers 224 and 22B are scaled by insulating member 38, except for the upper end portions of control terminals T1g, . . . , T4se. The insulation distance is reduced by sealing control pads P1g, . . . , P4se of semiconductor chips C1 to C4, the portions of control terminals T1g, . . . , T4se excluding the upper end portions, wiring portions 23A and 23B, and metal wires W by insulating member 38. The upper ends of control terminals T1g, . . . , T4se and the portions (DC terminals Tp and Tn and AC terminal Tac) outside the front surfaces of conductor layers 22A and 22B are exposed in the air.

As described above, in the present first embodiment, common control terminal T1ak is provided for two semiconductor chips C1 and C2, and common control terminal T2ak is provided for two semiconductor chips C3 and C4, thereby reducing the number of control terminals, compared with conventional examples. That is, if control terminals as many as the control pads and the emitter electrode of semiconductor chips C1 to C4 are provided, five control terminals are necessary for each of semiconductor chips C1 to C4. Since the upper end portions of the control terminals are not sealed by insulating member 38 and are exposed in the air, the control terminals need to be spaced apart from each other by a distance allowing for insulation.

If the number of semiconductor chips connected in parallel increases and the number of control terminals increases accordingly, the length of the control terminal row increases accordingly, which increases the size of the semiconductor module. In a semiconductor module including four switching semiconductor chips, if five control terminals are provided for each semiconductor chip, in total, 20 control terminals are necessary. By contrast, the present first embodiment requires, in total, 18 control terminals. Therefore, the present first embodiment can reduce the number of control terminals and achieve size reduction of the device.

In the present first embodiment, the distance from semiconductor chips C1 and C2 (or C3 and C4) to wiring portion 23A (or 23B) is shorter than the distance from semiconductor chips C1 and C2 (or C3 and C4) and control terminals T1g, ... (or T3g, ... ). This can reduce the length of the current path compared with when diodes 3 of semiconductor chips C1 and C2 (or C3 and C4) are connected on control substrate 39. This can reduce a voltage drop due to parasitic resistance and improve the accuracy of signal detection.

In the present first embodiment, since in each of semiconductor chips C1 to C4, the control pad (for example, P1a) for the anode of diode 3 and the control pad (for example, P1k) for the cathode are disposed adjacent to each other, the effect of electromagnetic interference can be reduced, and the accuracy of detecting forward voltage (for example, VF1) of diode 3 can be improved.

In the present first embodiment, IGBTs are used as transistors 2 of switching semiconductor chips C1 to C4. However, the embodiments are not limited thereto, and a MOSFET (metal-oxide-semiconductor field-effect transistor) may be used as transistor 2. In this case, a parasitic diode present in the MOSFET can be used as freewheel diode 4, without using rectifying semiconductor chips C11 to C14.

In the present first embodiment, temperature detecting elements (diodes 3) and overcurrent detecting cells (sense emitters) are provided only in switching semiconductor chips C1 to C4. However, temperature detecting elements and overcurrent detecting cells may be also provided in rectifying semiconductor chips C11 to C14.

In the present first embodiment, two sets of switching semiconductor chip C1, C2 (or C3, C4) and rectifying semiconductor chip C11, C12 (or C13, C14) are connected in parallel. However, N sets of a switching semiconductor chip and a rectifying semiconductor chip may be connected in parallel. N is an integer equal to or greater than two. In the present first embodiment, N=2.

When the first to N-th switching semiconductor chips are connected in parallel, N temperature-detecting diodes 3 are connected in series. Given that n is an integer equal to or greater than one and equal to or smaller than (N−1), the cathode of temperature-detecting diode 3 or the n-th semiconductor chip is connected to the anode of temperature-detecting diode 3 of the (n)th semiconductor chip.

A control terminal is connected to each or the anode of temperature-detecting diode 3 of the first semiconductor chip and the cathodes of temperature-detecting diodes 3 of the first to N-th semiconductor chips, and, in total, (N−1) temperature-detecting control terminals are provided. If a control terminal is connected to each of the anode and the cathode of temperature-detecting diode 3 of each of the first to N-th semiconductor chips, in total, 2N temperature-detecting control terminals are necessary. Therefore, the present first embodiment can reduce the number of temperature-detecting control terminals.

Furthermore, the number of switching semiconductor chips may not be equal to the number of rectifying semiconductor chips, and two switching semiconductor chips and one rectifying semiconductor chip may be connected in parallel.

In the present first embodiment, transistor 2 with an overcurrent detecting cell (sense emitter) is used. However, a transistor not having an overcurrent detecting cell (sense emitter) may be used.

In order to reduce the number of control terminals, control terminals T1g and T2g (or T3g and T4g) of switching semiconductor chips C1 and C2 (or C3 and C4) connected in parallel may be connected with each other, and control terminals T1e and T2e (or T1e and T4e) may be connected with each other.

Furthermore, instead using temperature-detecting diode 3 as a temperature detecting element, a thermistor with an electrical resistance value changing with temperature may be used. In this case, the thermistor is preferably disposed as close as possible to the semiconductor chip.

Furthermore, in a case where semiconductor chips formed of a wide-bandgap semiconductor such as SiC (Silicon Carbide) are used, inexpensive and compact semiconductor chips may be used, and a large number of semiconductor chips may be connected in parallel. The present first embodiment is also effective for reducing the site of the device in such a case.

Second Embodiment

Figure 6:
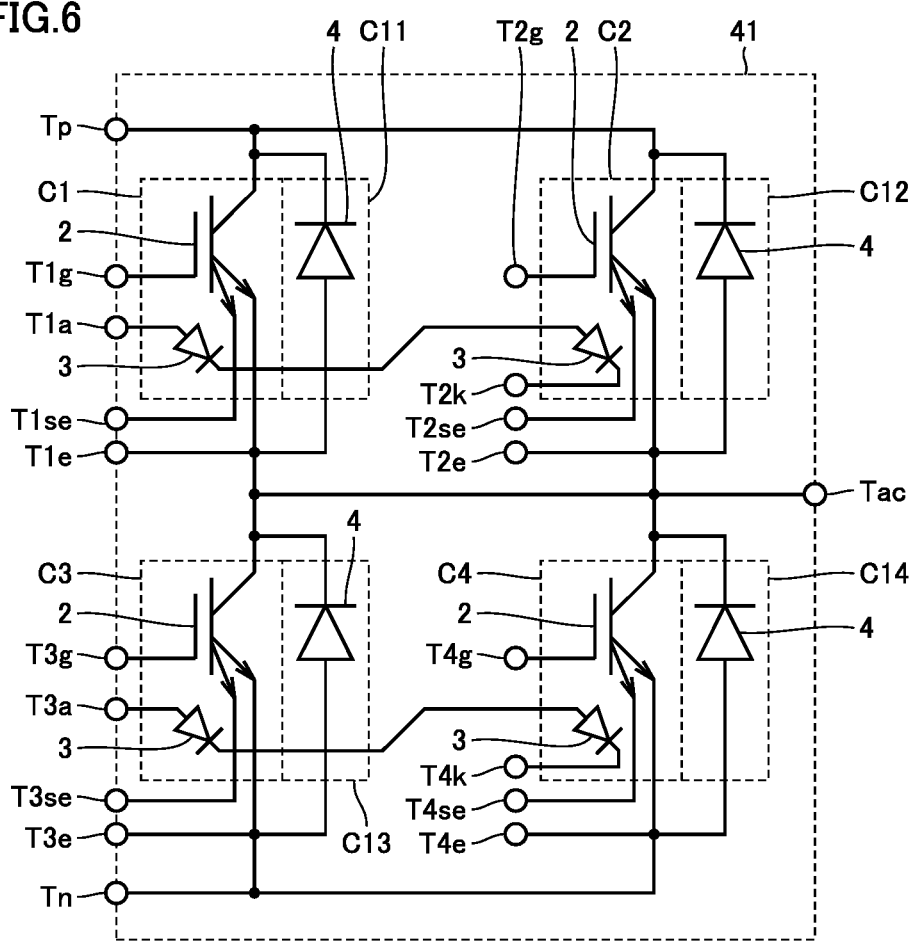
FIG. 6 is a circuit diagram shoving a configuration of a semiconductor module according to a second embodiment of the present invention.

FIG. 6 is a circuit diagram showing a configuration of a semiconductor module 41 according to a second embodiment of the present invention, in comparison with FIG. 1. Referring to FIG. 6, semiconductor module 41 differs from semiconductor module 1 in FIG. 1 in that control terminals T1ak and T2ak are removed. Temperature-detecting diodes 3 of semiconductor chips C1 and C2 are connected in series between control terminals T1a and T2k. Temperature-detecting diodes 3 of semiconductor chips C3 and C4 are connected in series between control terminals T3a and T4k.

Figure 7:
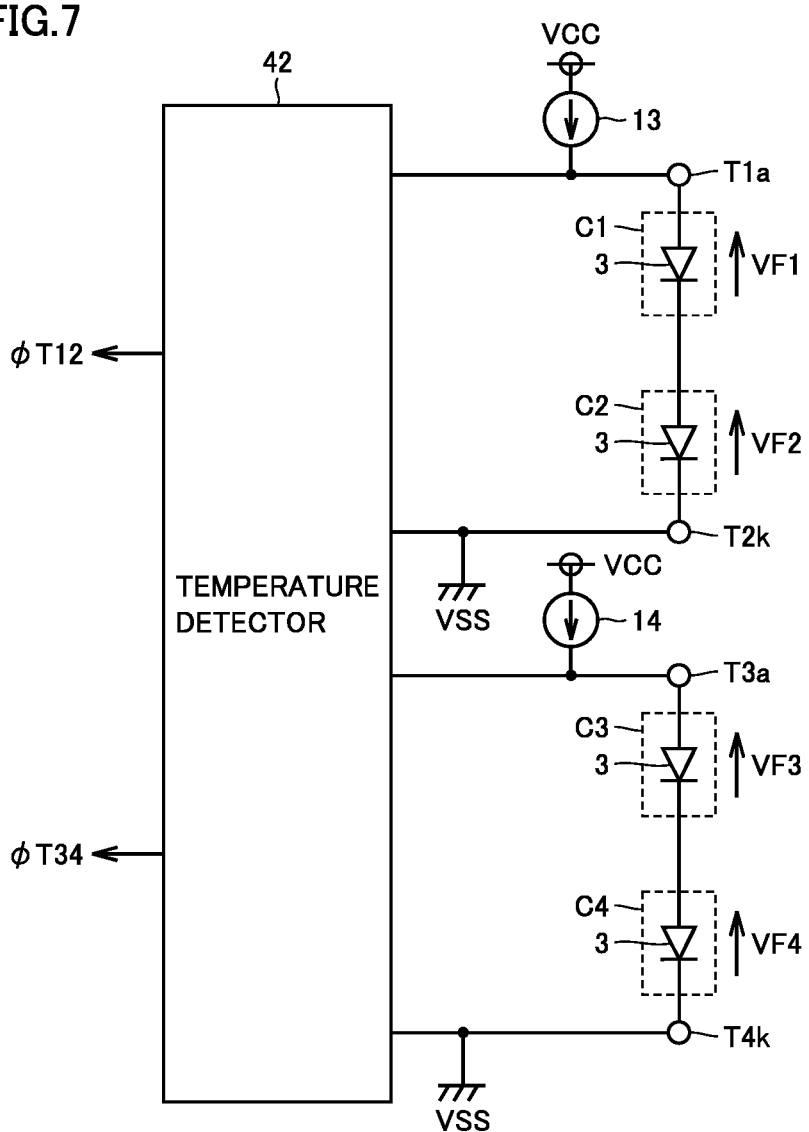
FIG. 7 is a circuit block diagram showing a configuration of a part related to detection of temperature of transistors in a control circuit controlling the semiconductor module shown in FIG. 6.

FIG. 7 is a circuit block diagram showing a configuration of a part related to detection of temperature of transistors 2 in control circuit 12 controlling semiconductor module 41, in comparison with FIG. 3. Referring to FIG. 7, this circuit part differs from the circuit part of FIG. 3 in that temperature detector 15 is replaced by a temperature detector 42.

Control terminals T1a, T2k, T3a, and T4k are all connected to temperature detector 42. Constant current source 13 is connected between the line of power supply voltage VCC and control terminal T1a. Constant current source 14 is connected between the line of power supply voltage VCC and control terminal T3a. Control terminals T2k and T4k are both connected to the line of ground voltage VSS. Although control terminals T2k and T4k are connected to the lines of the same voltage here, they may be connected to lines of different voltages.

Thus, constant current flows through each of temperature-detecting diodes 3 of semiconductor chips C1 to C4, and forward voltages VF1 to VF4 are generated in diodes 3 of semiconductor chips C1 to C4, respectively. When transistors 2 of semiconductor chips C1 to C4 are turned on and off a loss occurs in each transistor 2, and this loss generates heat, which increases the temperature of transistor 2.

When temperatures T1 to T4 of transistors 2 of semiconductor chips C1 to C4 rise, forward voltages VF1 to VF4 of temperature-detecting diodes 3 of semiconductor chips C1 to C4 decrease accordingly. Temperature detector 42 obtains the average temperature of transistors 2 of semiconductor chips C1 and C2: T12 (T1+T2)/2, based on the average value (VF1+VF2)/2 of forward voltages VF1 and VF2, and outputs a signal φT12 indicating the obtained average temperature T12.

Furthermore, temperature detector 42 obtains the average temperature of transistors 2 of semiconductor chips C3 and C4: T34=(T3+T4)/2, based on the average value (VF3+VF4)/2 of forward voltages VF3 and VF4, and outputs a signal φT34 indicating the obtained average temperature T34. Control circuit 12 adjusts, for example, the on time (that is, current) and the on and off frequencies of transistors 2 of semiconductor chips C1 to C4 such that average temperatures T12 and T34 indicated by signals φT12 and φT34 do not exceed a predetermined upper limit temperature.

Figure 8:
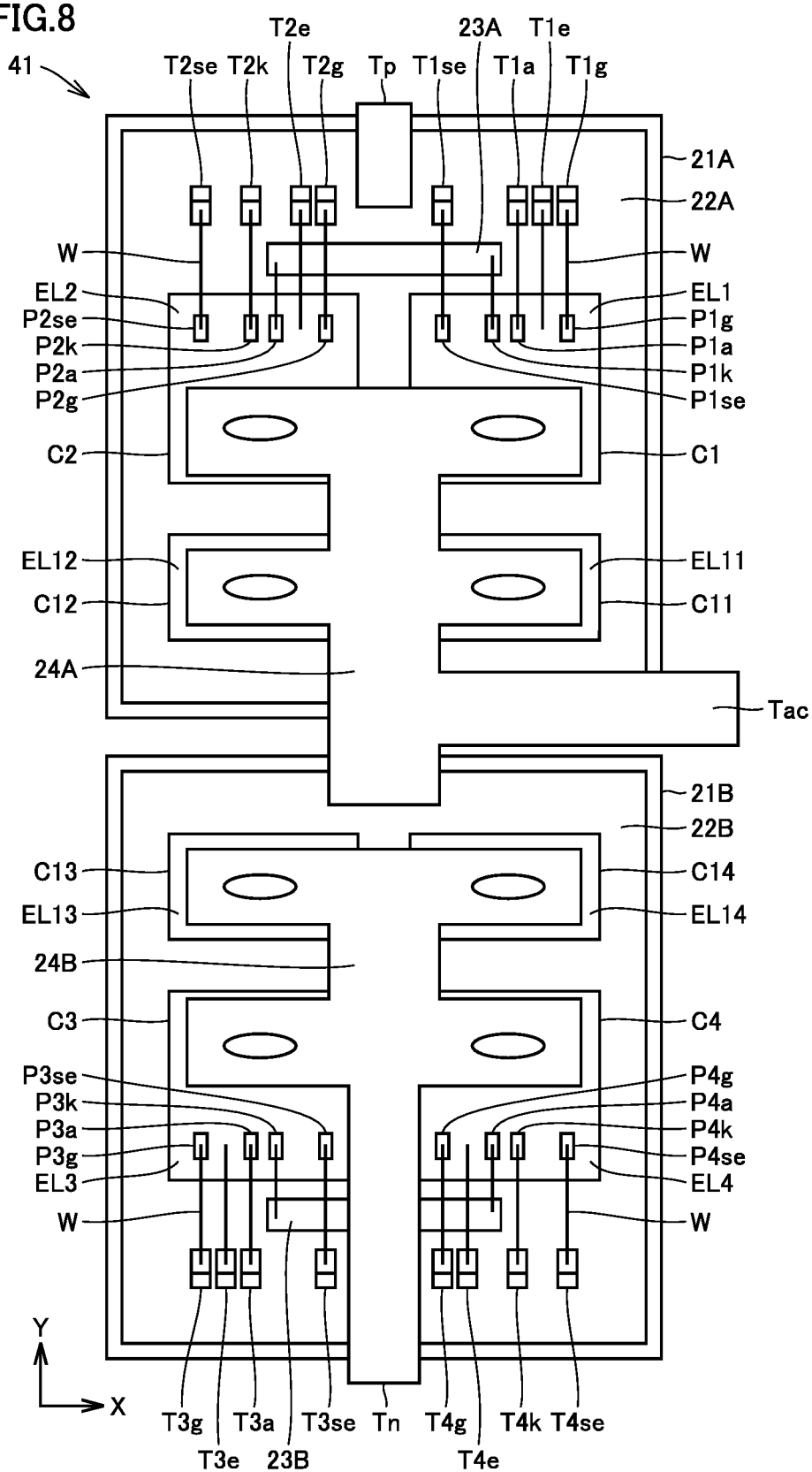
FIG. 8 is a diagram showing a layout of the semiconductor module shown in FIG. 6.

FIG. 8 is a diagram showing a layout of semiconductor module 41, in comparison with FIG. 4. Referring to FIG. 8, semiconductor module 41 differs from semiconductor module 1 in that control terminals T1ak and T2ak are removed. Metal wire W connecting control terminal T1ak to wiring portion 23A and metal wire W connecting control terminal T2ak to wiring portion 23B are removed. Thus, temperature-detecting diodes 3 of semiconductor chips C1 and C2 are connected in series between control terminals T1a and T2k. Temperature-detecting diodes 3 of semiconductor chips C3 and C4 are connected in series between control terminals T3a and T4k.

In this second embodiment, since control terminals T1ak and T2ak are removed, the number of control terminals can be reduced, compared with the first embodiment, thereby achieving size reduction of the device.

In the present second embodiment, two sets of switching semiconductor chip C1, C2 (or C3, C4) and rectifying semiconductor chip C11, C12 (or C13, C14) are connected in parallel. However, N sets of a switching semiconductor chip and a rectifying semiconductor chip may be connected in parallel. N is an integer equal to or greater than two. In the present second embodiment, N=2.

When the first to N-th switching semiconductor chips are connected in parallel, N temperature-detecting diodes 3 are connected in series. Given that n is an integer equal to or greater than one and equal to or smaller than (N−1), the cathode of temperature-detecting diode 3 or the n-th semiconductor chip is connected to the anode of temperature-detecting diode 3 of the (n·1)th semiconductor chip.

A control terminal is connected to each or the anode of temperature-detecting diode 3 of the first semiconductor chip, the cathode of temperature-detecting diode 3 of the N-th semiconductor chip, and, in total, two temperature-detecting control terminals are provided. If a control terminal is connected to each of the anode and the cathode of temperature-detecting diode 3 of each of the first to N-th semiconductor chips, in total, 2N temperature-detecting control terminals are necessary. Therefore, the present second embodiment can reduce the number of temperature-detecting control terminals.

Third Embodiment

Figure 9:
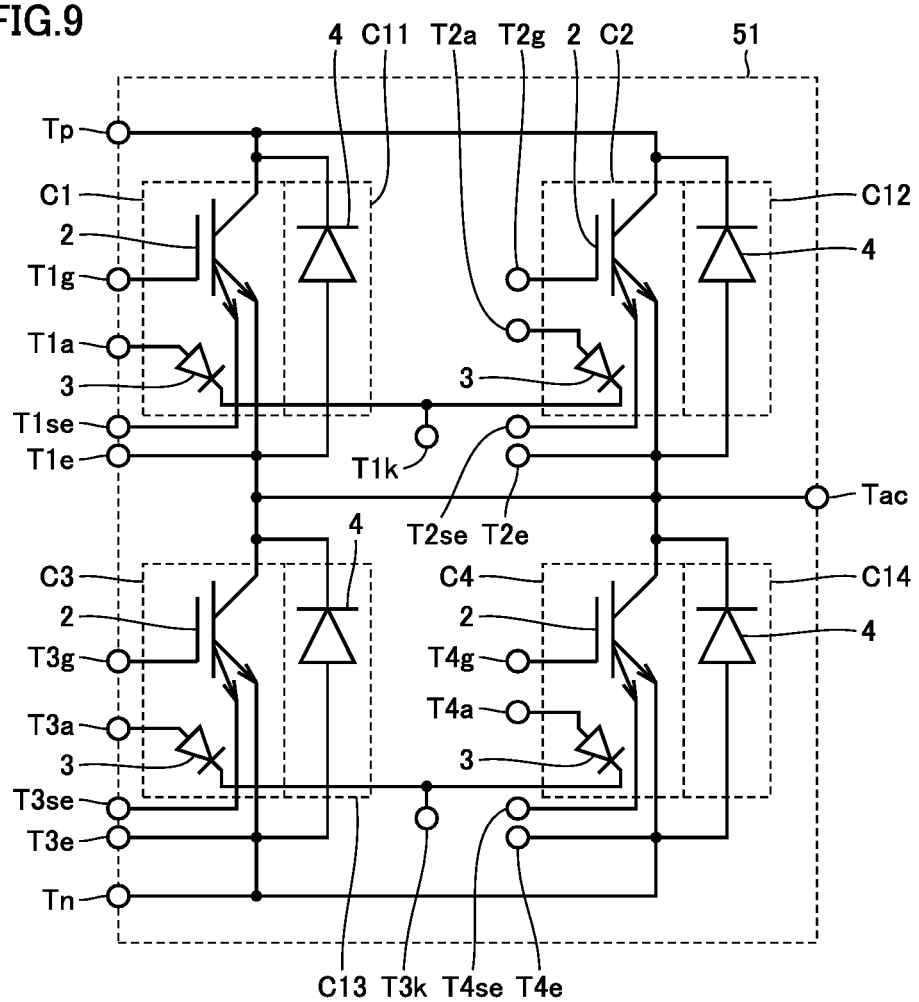
FIG. 9 is a circuit diagram showing a configuration of a semiconductor module according to a third embodiment of the present invention.

FIG. 9 is a circuit diagram showing a configuration of a semiconductor module 51 according to a third embodiment of the present invention, in comparison with FIG. 1. Referring t FIG. 9, semiconductor module 51 differs from semiconductor module 1 in FIG. 1 in that control terminals T1ak, T2ak, T2k, and T4k are removed and control terminals T1k, T3k, T2a, and T4a are added.

The cathodes of temperature-detecting diodes 3 of semiconductor chips C1 and C2 are both connected to control terminal T1k, and the anode of temperature-detecting diode 3 of semiconductor chip C2 is connected to control terminal T2a. The cathodes of temperature-detecting diodes 3 of semiconductor chips C3 and C4 are both connected to control terminal T3k, and the anode of temperature-detecting diode 3 of semiconductor chip C4 is connected to control terminal T4a.

Figure 10:
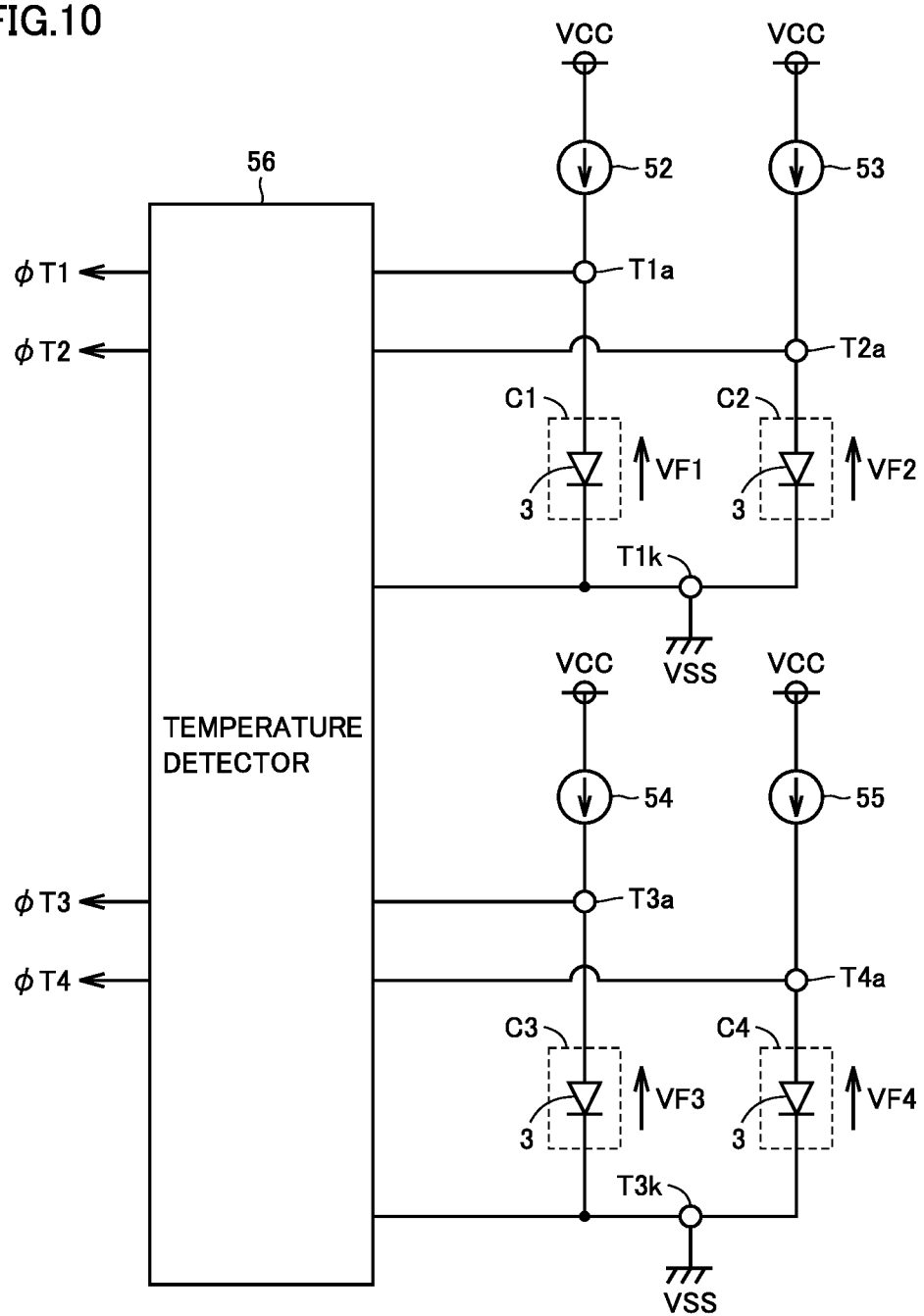
FIG. 10 is a circuit block diagram showing a configuration of a part related to detection of temperature of transistors in a control circuit controlling the semiconductor module shown in FIG. 9.

FIG. 10 is a circuit block diagram showing a configuration of a part related to detection of temperature of transistors 2 in control circuit 12 controlling semiconductor module 51, in comparison with FIG. 3. In FIG. 10, control circuit 12 includes constant current sources 52 to 55 and a temperature detector 56. Control terminals T1a, T2a, T1k, T3a, T4a, and T3k are all connected to temperature detector 56.

Constant current source 52 is connected between the line of power supply voltage VCC and control terminal T1a. Constant current source 53 is connected between the line of power supply voltage VCC and control terminal T2a. Constant current source 54 is connected between the line of power supply voltage VCC and control terminal T3a. Constant current source 55 is connected between the line of power supply voltage VCC and control terminal T4a. Control terminals T1k and T3k are both connected to the line of ground voltage VSS. Although control terminals T1k and T3k are connected to the lines of the same voltage here, they may be connected to lines of different voltages.

Thus, constant current flows through each of temperature-detecting diodes 3 of semiconductor chips C1 to C4, and forward voltages VF1 to VF4 are generated in temperature-detecting diodes 3 of semiconductor chips C1 to C4, respectively. When transistors 2 of semiconductor chips C1 to C4 are turned on and off, a loss occurs in each transistor 2, and the loss generates heat, which increases the temperature of transistor 2.

When temperatures T1 to T4 of transistors 2 of semiconductor chips C1 to C4 rise, forward voltages VF1 to VF4 of temperature-detecting diodes 3 of semiconductor chips C1 to C4 decrease accordingly. Temperature detector 56 obtains temperatures T1 to T4 of transistors 2 of semiconductor chips C1 to C4 based on forward voltages VF1 to VF4 and outputs signals φT1 to φT4 indicating the obtained temperatures T1 to T4. Control circuit 12 adjusts, for example, the on time (that is, current) and the on and off frequencies of transistors 2 of semiconductor chips C1 to C4 such that temperatures T1 to T4 indicated by signals φ1 to φ4 do not exceed a predetermined upper limit temperature.

Figure 11:
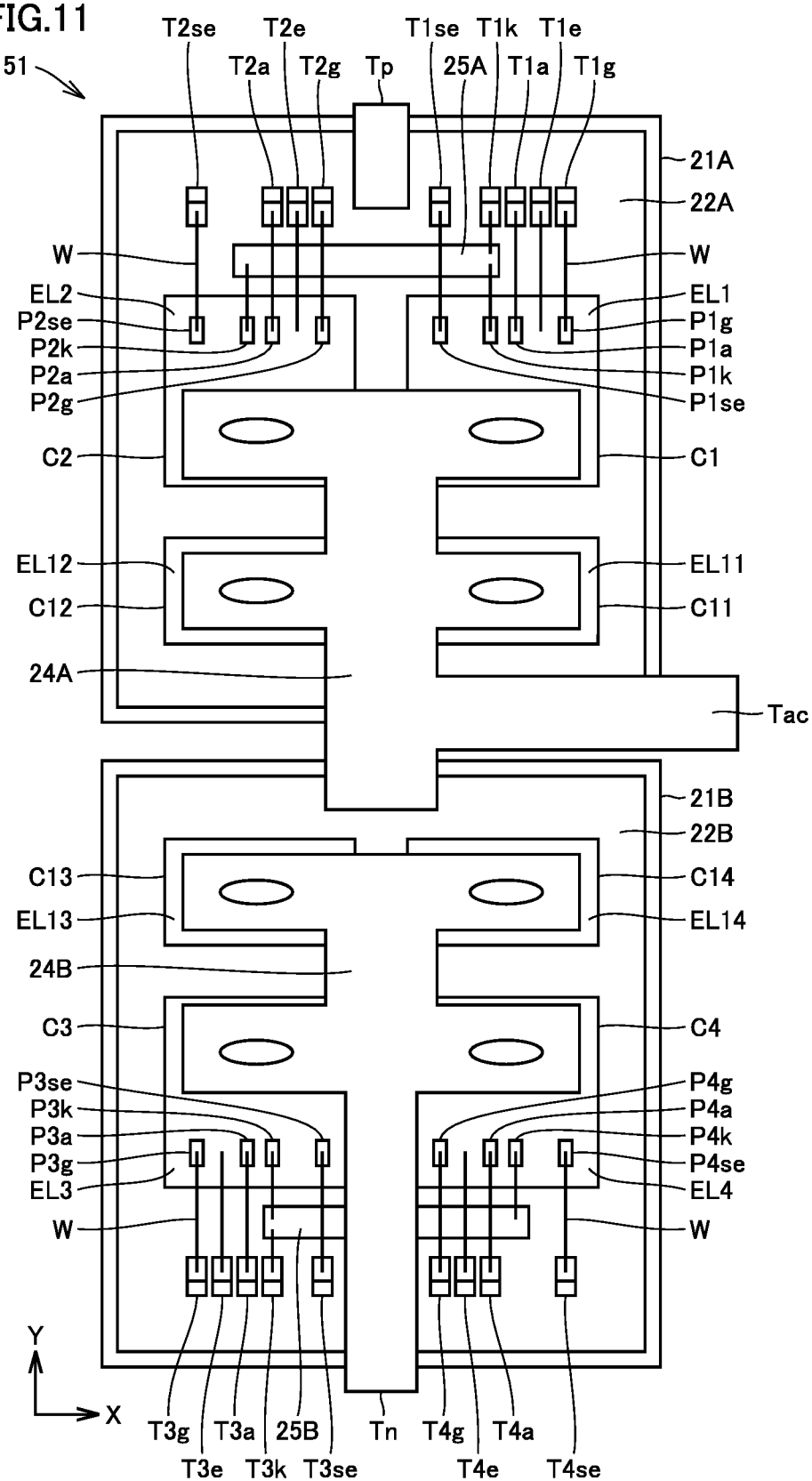
FIG. 11 is a diagram showing a layout of the semiconductor module shown in FIG. 9.

FIG. 11 is a diagram showing a layout of semiconductor module 51, in comparison with FIG. 4. Referring to FIG. 11 semiconductor module 51 differs from semiconductor module 1 in that control terminals T1ak and T2ak are respectively replaced by control terminals T2a and T4a, control terminals T2k and T4k are removed, control terminals T1k and T3k are added, and wiring portions 23A and 23B are respectively replaced by wiring portions 25A and 25B.

Control pad P2a of semiconductor chip C2 is connected to control terminal T2a through metal wire W. Control pad P2k of semiconductor chip C2 is connected to one end portion of wiring portion 25A through metal wire W. Control pad P1k of semiconductor chip C1 is connected to the other end portion of wiring portion 25A through metal wire W. Control terminal T1k is disposed adjacent to control terminal T1a in the Y direction of control pad P1k. Control terminal T1k is connected to the other end portion of wiring portion 25A through metal wire W. Thus, the anode of temperature-detecting diode 3 of semiconductor chip C2 is connected to control terminal T2a, and the cathodes of temperature-detecting diodes 3 of semiconductor chips C1 and C2 are both connected to control terminal T1k.

Control pad P4a of semiconductor chip C4 is connected to control terminal T4a through metal wire W. Control pad P3k of semiconductor chip C3 is connected to one end portion of wiring portion 25B through metal wire W. Control terminal T3k is disposed adjacent t control terminal T3a in the Y direction of control pad P3k. Control terminal T3k is connected to one end portion of wiring portion 25B through metal wire W. Control pad P4k of semiconductor chip C4 is connected to the other end portion of wiring portion 25B through metal wire W. Thus, the anode of temperature-detecting diode 3 of semiconductor chip C4 is connected to control terminal T4a, and the cathodes of temperature-detecting diodes 3 of semiconductor chips C3 and C4 are both connected to control terminal T3k.

In this third embodiment, common control terminal T1k is provided for two semiconductor chips C1 and C2, and common control terminal T3k is provided for two semiconductor chips C3 and C4, thereby reducing the number of control terminals, compared with conventional examples. That is, if control terminals as many as the control pads and the emitter electrode of semiconductor chips C1 to C4 are provided, five control terminals are necessary for each of semiconductor chips C1 to C4. Since the upper end portions of the control terminals are not sealed by insulating member 38 and are exposed in the air, the control terminals need to be spaced apart from each other by a distance allowing for insulation. If the number of semiconductor chips connected in parallel increases and the number of control terminals increases accordingly, the length of the control terminal row increases accordingly, which increases the size of the semiconductor module. In a semiconductor module including four switching semiconductor chips, if five control terminals are provided for each semiconductor chip, in total, 20 control terminals are necessary. By contrast, the present third embodiment requires, in total, 18 control terminals. Therefore, the present third embodiment can reduce the number of control terminals and achieve size reduction of the device.

In the present third embodiment, wiring portion 25A (or 25B) is disposed between semiconductor chips C1, C2 (or C3, C4) and control terminals T12, ... (or T3g, ... ). In other words, the distance from semiconductor chips C1 and C2 (or C3 and C4) to wiring portion 25A (or 25B) is shorter than the distance from semiconductor chips C1 and C2 (or C3 and C4) to control terminals T1g, ... (or T3g, ... ). Therefore, the length of the current path can be reduced, compared with when temperature-detecting diodes 3 of semiconductor chips C1, C2 (or C3, C4) are connected on control substrate 39. This can reduce a voltage drop due to parasitic resistance and improve the accuracy of signal detection.

In the present third embodiment, two sets of switching semiconductor chip C1, C2 (or C3, C4) and rectifying semiconductor chip C11, C12 (or C13, C14) are connected in parallel. However, N sets of a switching semiconductor chip and a rectifying semiconductor chip may be connected in parallel. N is an integer equal to or greater than two. In the present second embodiment, N 2.

When the first t N-th switching semiconductor chips are connected in parallel, the cathodes of N temperature-detecting diodes 3 are connected with each other. Given that n is an integer equal t or greater than one and equal to or smaller than (N−1), the cathode of temperature-detecting diode 3 of the n-th semiconductor chip is connected to the cathode of temperature-detecting diode 3 of the (n−1)th semiconductor chip.

A control terminal is connected to each of the anodes of temperature-detecting diodes 3 of the first to N-th semiconductor chips, a common control terminal is connected to the cathodes of temperature-detecting diodes 3 of the first to N-th semiconductor chips, and, in total, (N+1) temperature-detecting control terminals are provided. If a control terminal is connected to each of the anode and the cathode of each of temperature-detecting diodes 3 of the first to N-th semiconductor chips, in total, 2N temperature-detecting control terminals are necessary. Therefore, the present third embodiment can reduce the number of temperature-detecting control terminals.

Fourth Embodiment

Figure 12:
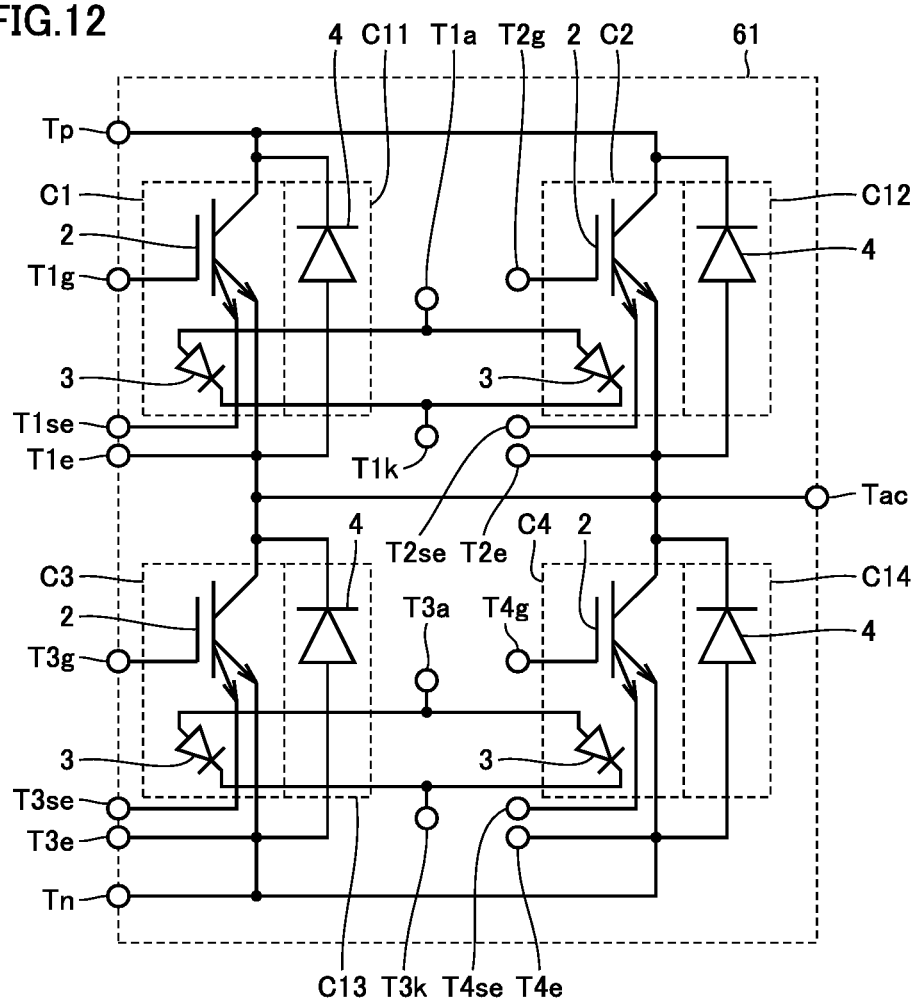
FIG. 12 is a circuit diagram showing a configuration of a semiconductor module according to a fourth embodiment of the present invention.

FIG. 12 is a circuit diagram showing a configuration of a semiconductor module 61 according to a fourth embodiment of the present invention, in comparison with FIG. 9. Referring to FIG. 12, semiconductor module 61 differs from semiconductor module 51 in FIG. 9 in that control terminals T2a and T4a are removed. The anodes of temperature-detecting diodes 3 of semiconductor chips C1 and C2 are both connected to control terminal T1a. Temperature-detecting diodes 3 of semiconductor chips C1 and C2 are connected in parallel between control terminals T1a and T1k. The anodes of temperature-detecting diodes 3 of semiconductor chips C3 and C4 are both connected to control terminal T3a. Temperature-detecting diodes 3 of semiconductor chips C3 and C4 are connected in parallel between control terminals T3a and T3k.

Figure 13:
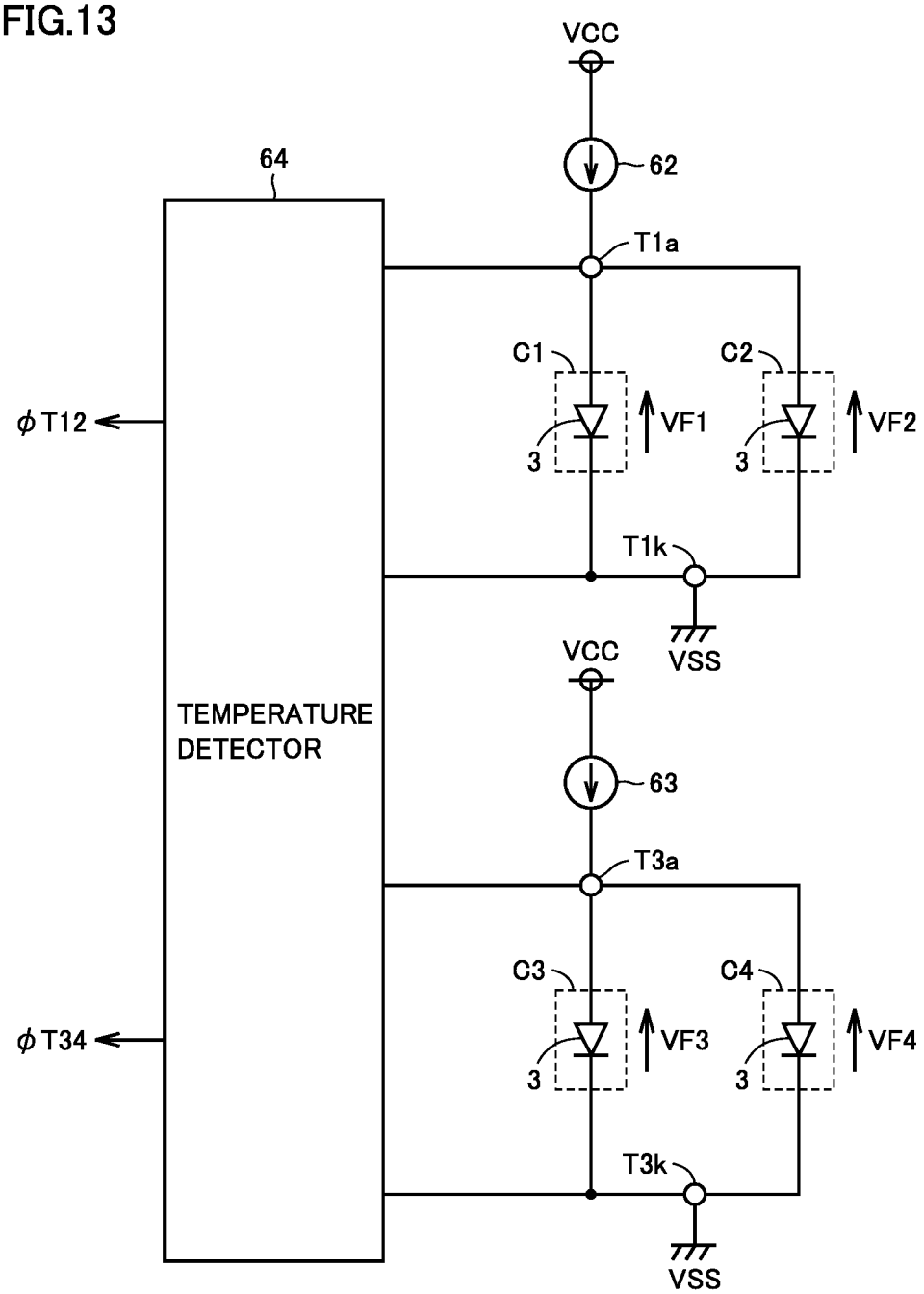
FIG. 13 is a circuit block diagram showing a configuration of a part related to detection of temperature of transistors in a control circuit controlling the semiconductor module shown in FIG. 12.

FIG. 13 is a circuit block diagram showing a configuration of a part related to detection of temperature of transistors 2 in control circuit 12 controlling semiconductor module 61, in comparison with FIG. 10. In FIG. 13, control circuit 12 includes constant current sources 62 and 63 and a temperature detector 64. Control terminals T1a, T3a, T1k, and T3k are all connected to temperature detector 64.

Constant current source 62 is connected between the line of power supply voltage VCC and control terminal T1a. Constant current source 53 is connected between the line of power supply voltage VCC and control terminal 13a. Control terminals T1k and 13k are both connected to the line of ground voltage VSS. Although control terminals T1k and T3k are connected to the lines of the same voltage here, they may be connected to lines of different voltages.

Current from constant current source 62 is divided into temperature-detecting diodes 3 of semiconductor chips C1 and C2 such that forward voltages VF1 and VF2 of temperature-detecting diodes 3 of semiconductor chips C1 and C2 have the same value. Electric resistance values R1 and R2 in the forward direction of diodes 3 of semiconductor chips C1 and C2 change according to temperatures T1 and T2 of transistors 2 of semiconductor chips C1 and C2, respectively. The ratio 11/12 between currents 11 and 12 flowing through temperature-detecting diodes 3 of semiconductor chips C1 and C2 is the inverse ratio R2/R1 between electric resistance values R1 and R2 of transistors 2 of semiconductor chips C1 and C2.

Temperature detector 64 estimates average temperature T12 of transistors 2 of semiconductor chips C1 and C2, based on the current value obtained by dividing the current value of constant current source 62 by the parallel number (in this case, two) of temperature-detecting diodes 3, and the output voltage VF1=VF2, and outputs a signal φT12 indicating the estimated average temperature T12.

Similarly, temperature detector 64 estimates average temperature T34 of transistors 2 of semiconductor chips C3 and C4, based on the current value obtained by dividing the current value of constant current source 63 by the parallel number (in this case, two) of temperature-detecting diodes 3, and the output voltage VF3=VF4, and outputs a signal φT34 indicating the estimated average temperature T34. Control circuit 12 adjusts, for example, the on time (that is, current) and the on and off frequencies of transistors 2 of semiconductor chips C1 to C4 such that average temperatures T12 and T34 indicated by signals φT12 and φT34 do not exceed a predetermined upper limit temperature.

Figure 14:
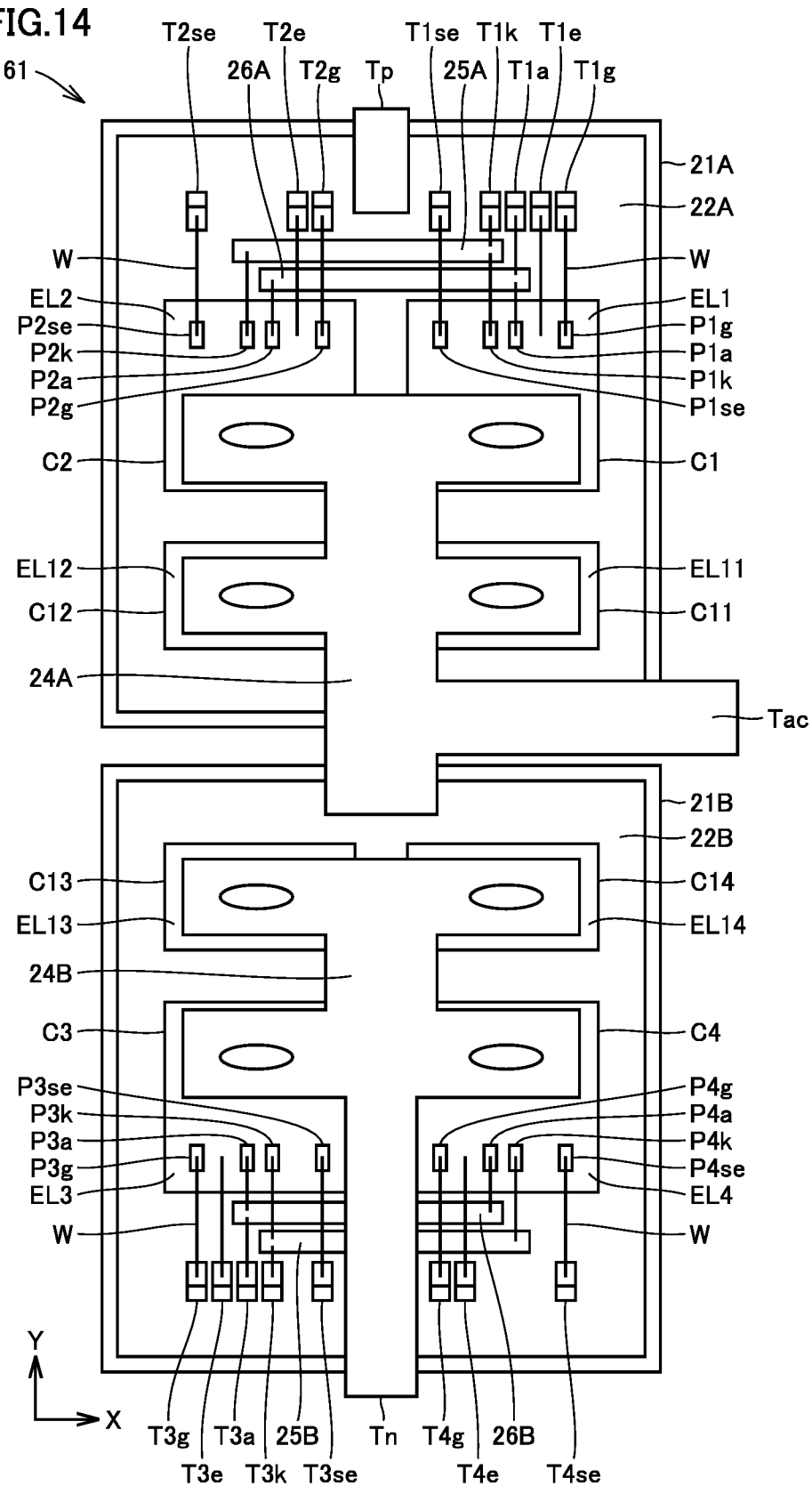
FIG. 14 is a diagram showing a layout of the semiconductor module shown in FIG. 12.

FIG. 14 is a diagram showing a layout of semiconductor module 61, in comparison with FIG. 11. Referring to FIG. 14, semiconductor module 61 differs from semiconductor module 51 in that control terminals T2a and T4a are removed and wiring portions 26A and 26B are added.

At the front surface of conductor layer 22A, a strip-like wiring portion 26A is formed in a region between semiconductor chips C2, C1 and wiring portion 25A. The distance from control terminals T2se, T2e, T2g, T1se, T1k, T1a, T1e, and T1g to semiconductor chips C2 and C1 is larger than the distance From wiring portion 26A to semiconductor chips C2 and C1. Wiring portion 26A extends in the X direction and is insulated from conductor layer 22A.

One end portion of wiring portion 26A is connected to control pad P2a through metal wire W. The other end portion of wiring, portion 26A is connected to control pad P1k through metal wire W and connected to control terminal T1a through metal wire W. Thus, the cathode of temperature-detecting diode 3 of semiconductor chip C1 and the anode of temperature-detecting diode 3 of semiconductor chip C2 are connected to control terminal T1a. Temperature-detecting diodes 3 of semiconductor chips C1 and C2 are connected in parallel between control terminals T1a and T1k.

At the front surface of conductor layer 22B, a strip-like wiring portion 26B is formed in a region between semiconductor chips C3, C4 and wiring portion 25B. The distance from control terminals T3g, T3e, T3a, T3k, T3se, T4g, T4e, and T4se to semiconductor chips C3 and C4 is larger than the distance From wiring portion 26B to semiconductor chips C3 and C4. Wiring portion 26B extends in the X direction and is insulated from conductor layer 22B.

One end portion of wiring portion 26B is connected to control pad P3a through metal wire W and connected to control terminal T3a through metal wire. The other end portion of wiring portion 26B is connected to control pad P4a through metal wire W. Thus, the anode of temperature-detecting diode 3 of semiconductor chip C3 and the anode of temperature-detecting diode 3 of semiconductor chip C4 are connected to control terminal T3a. Temperature-detecting diodes 3 of semiconductor chips C3 and C4 are connected in parallel between control terminals T3a and T3k.

In this fourth embodiment, since control terminals T2a and T4a are removed, the number of control terminals can be reduced compared with the third embodiment, thereby achieving size reduction of the device.

The number of control terminals is the same as in the second embodiment. The voltage VF1=VF2 (or VF3=VF4) applied to temperature detector 64 is ½ of the voltage VF1+VF2 (or VF3+VF4) applied to temperature detector 42 in the second embodiment. On the contrary, the current value of constant current sources 62 and 63 is twice the current value of constant current sources 13 and 14 in the second embodiment.

In the present fourth embodiment, two sets of switching semiconductor chip C1, C2 (or C3, C4) and rectifying semiconductor chip C11, C12 (or C13, C14) are connected in parallel. However, N sets of a switching semiconductor chip and a rectifying semiconductor chip may be connected in parallel. N is an integer equal to or greater than two. In the present fourth embodiment, N=2.

When the first to N-th switching semiconductor chips are connected in parallel, the anodes of N temperature-detecting diodes 3 are connected with each other, and the cathodes of N temperature-detecting diodes 3 are connected with each other. Given that n is an integer equal to or greater than one and equal to or smaller than (N−1), the anode of temperature-detecting diode 3 of the n-th semiconductor chip is connected to the anode of temperature-detecting diode 3 of the (n+1)th semiconductor chip. The cathode of temperature-detecting diode 3 of the n-th semiconductor chip is connected to the cathode of temperature-detecting diode 3 of the (n+1)th semiconductor chip.

A common control terminal is connected to the anodes of temperature-detecting diodes 3 of the first to N-th semiconductor chips, a common control terminal is connected to the cathodes of temperature-detecting diodes 3 of the first to N-th semiconductor chips, and, in total, two temperature-detecting control terminals are provided. If a control terminal is connected to each of the anode and the cathode of temperature-detecting diode 3 or each of the first to N-th semiconductor chips, in total, 2N temperature-detecting control terminals are necessary. Therefore, the present fourth embodiment can reduce the number of temperature-detecting control terminals.

It is needless to say that the first to fourth embodiments and modifications thereof can be combined as appropriate.

The embodiment disclosed here should be understood as being illustrative rather than being limitative in all respects. The scope of the present invention is shown not in the foregoing description but in the claims, and it is intended that all modifications that come within the meaning and range of equivalence to the claims are embraced here.

REFERENCE SIGNS LIST 1, 41, 51, 61 semiconductor module, Tp, Tn DC terminal, Tac AC terminal, T1g to T4g, T1se to T4se, T1e to T4e, T1a to T4a, T1ak, T2ak, T1k to T4k control terminal, C1 to C4, C11 to C14 semiconductor chip, 2 transistor, 3 diode, 4 freewheel diode, 10 DC power supply, 11 load, 12 control circuit, 13, 14, 52 to 55, 62, 63 constant current source, 15, 42, 56, 64 temperature detector, 21A, 21B substrate, 20A, 20B, 22A, 22B conductor layer, P1se to P4se, P1k to P4k, P1a to P4a, P1g to P4g control pad, EL1 to EL4 emitter electrode, EL11 to EL14 anode electrode 23A, 23B, 25A, 25B, 26A, 26B wiring portion, W metal wire, 24A, 24B lead frame, 31 to 34 bonding member, 35, 36 insulator layer, 37 housing, 38 insulating member 39 control substrate.

The invention claimed is:

1. A semiconductor module comprising:
   first to N-th semiconductor chips disposed on a conductive layer; and
   first and second external terminals, where N is an integer equal to or greater than two, each of the first to N-th semiconductor chips including
a switching element,
first and second internal terminals, and
a temperature detecting element connected between the first and second internal terminals and having a resistance value changing according to temperature of the switching element,
the first internal terminal of the first semiconductor chip being connected to the first external terminal,
the second internal terminal of the N-th semiconductor chip being connected to the second external terminal,
wherein given that n is an integer equal to or greater than one and equal to or smaller than (N−1), one of the first and second internal terminals of an n-th semiconductor chip and one of the first and second internal terminals of an (n+1)th semiconductor chip are connected with each other,
the semiconductor module further comprises a wiring portion adjacent to the n-th and (n+1)th semiconductor chips, disposed spatially between the first and second internal terminals of the n-th and (n+1)th semiconductor chips and the first and second external terminals in a direction parallel to a first surface of the conductive layer and insulated from the conductive layer, and
one of the first and second internal terminals of the n-th semiconductor chip and one of the first and second internal terminals of the (n+1)th semiconductor chip are both electrically connected to the wiring portion.

2. The semiconductor module according to claim 1, wherein
the first internal terminal of the first semiconductor chip is connected to one end portion of the first external terminal, and the second internal terminal of the N-th semiconductor chip is connected to one end portion of the second external terminal,
a portion through which current flows between the first internal terminal of the first semiconductor chip and one end portion of the first external terminal and a portion through which current flows between the second internal terminal of the N-th semiconductor chip and one end portion of the second external terminal are sealed by an insulating member, and
the other end portions of the first and second external terminals are exposed to outside of the insulating member.

3. The semiconductor module according to claim 1, wherein
the wiring portion and the first and second external terminals are disposed on the first surface of the conductive layer.

4. The semiconductor module according to claim 3, wherein a distance from the first and second external terminals to the n-th and (n+1)th semiconductor chips is larger than a distance from the wiring portion to the n-th and (n+1)th semiconductor chips.

5. The semiconductor module according to claim 3, comprising an insulating material deposited over the conductive layer, the wiring portion, the n-th and (n+1)th semiconductor chips, and the first and second external terminals, and sealing the wiring portion and the n-th and (n+1)th semiconductor chips.

6. The semiconductor module according to claim 1, wherein in each of the first to N-th semiconductor chips, the first and second internal terminals are disposed adjacent to each other.

7. The semiconductor module according to claim 1, wherein
the temperature detecting element is a diode,
the first internal terminal is connected to an anode of the diode, and
the second internal terminal is connected to a cathode of the diode.

8. The semiconductor module according to claim 1, wherein N switching elements included in the first to N-th semiconductor chips are connected in parallel with each other.

9. The semiconductor module according to claim 1, wherein the second internal terminal of the n-th semiconductor chip and the first internal terminal of the (n+1)th semiconductor chip are connected with each other.

10. The semiconductor module according to claim 9, further comprising a third external terminal shared by the n-th and (n+1)th semiconductor chips and connected to the second internal terminal of the n-th semiconductor chip and the first internal terminal of the (n+1)th semiconductor chip.

11. The semiconductor module according to claim 1, further comprising (N−1) external terminals corresponding to second to N-th semiconductor chips, each of the (N−1) external terminals being connected to the first internal terminal of the corresponding semiconductor chip,
wherein the second internal terminal of the n-th semiconductor chip and the second internal terminal of the (n+1)th semiconductor chip are connected with each other.

12. The semiconductor module according to claim 1, wherein
the first internal terminals of the first to N-th semiconductor chips are all connected to the first external terminal, and
the second internal terminals of the first to N-th semiconductor chips are all connected to the second external terminal.

13. The semiconductor module according to claim 1, comprising a third external terminal directly connected to the wiring portion.

14. A semiconductor module comprising:
first to N-th semiconductor chips disposed on a first surface;
first and second external terminals disposed on the first surface, where N is an integer equal to or greater than two,
each of the first to N-th semiconductor chips including
a switching element,
first and second internal terminals, and
a temperature detecting element connected between the first and second internal terminals and having a resistance value changing according to temperature of the switching element,
the first internal terminal of the first semiconductor chip being connected to the first external terminal,
the second internal terminal of the N-th semiconductor chip being connected to the second external terminal,
wherein given that n is an integer equal to or greater than one and equal to or smaller than (N−1), one of the first and second internal terminals of an n-th semiconductor chip and one of the first and second internal terminals of an (n+1)th semiconductor chip are connected with each other,
the semiconductor module further comprises a wiring portion adjacent to the n-th and (n+1)th semiconductor chips and disposed spatially between the first and second internal terminals of the n-th and (n−1)th semiconductor chips and the first and second external terminals in a direction parallel to the first surface, and one of the first and second internal terminals of the n-th semiconductor chip and one of the first and second internal terminals of the (n+1)th semiconductor chip are both electrically connected to the wiring portion.

15. The semiconductor module according to claim 14, comprising a third external terminal disposed on the first surface and connected to the wiring portion.

16. The semiconductor module according to claim 14, wherein the wiring portion is disposed between the first and second internal terminals of the n-th and (n+1)th semiconductor chips and the first and second external terminals.

* * * * *